(12) United States Patent
Tsukizawa

(10) Patent No.: US 7,567,139 B2
(45) Date of Patent: Jul. 28, 2009

(54) VOLTAGE CONTROLLED OSCILLATOR, AND PLL CIRCUIT AND WIRELESS COMMUNICATION APPARATUS USING THE SAME

(75) Inventor: Takayuki Tsukizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 119 days.

(21) Appl. No.: 11/882,945

(22) Filed: Aug. 7, 2007

(65) Prior Publication Data

US 2008/0036547 A1 Feb. 14, 2008

(51) Int. Cl.
*H03B 1/00* (2006.01)
(52) U.S. Cl. .................. 331/177 V; 331/36 C; 331/167; 331/117 R; 331/117 FE
(58) Field of Classification Search ............. 331/177 V, 331/167, 117 R, 117 FE
See application file for complete search history.

(56) References Cited

U.S. PATENT DOCUMENTS 6,833,769 B2 * 12/2004 Seppinen et al. ........ 331/177 V
7,471,164 B2 * 12/2008 Reimann ................ 331/177 V

FOREIGN PATENT DOCUMENTS

JP  2001-352218  12/2001
JP  2004-147310  5/2004

* cited by examiner

*Primary Examiner*—Arnold Kinkead
(74) *Attorney, Agent, or Firm*—Wenderoth, Lind & Ponack, L.L.P.

(57) ABSTRACT

A voltage controlled oscillator including an inductor circuit including inductors 101, 102, a variable capacitance circuit 110 having variable capacitance elements 111, 112 changing a capacitance according to a voltage difference between two terminals thereof and having capacitive elements 113, 114 cutting a DC component, a negative resistance circuit including cross-coupled oscillating transistors 103, 104, and a time-switched level shift circuit 108 for shifting a reference voltage to two or more levels in a predetermined period. A connection point A of the variable capacitance elements is supplied with a control voltage Vt controlling an oscillation frequency, and connection points B, C of the variable capacitance elements and the capacitive elements are supplied with a reference voltage Vref output from the time-switched level shift circuit 108 via resistors 115, 116.

39 Claims, 24 Drawing Sheets

VOLTAGE CONTROLLED OSCILLATOR, AND PLL CIRCUIT AND WIRELESS COMMUNICATION APPARATUS USING THE SAME

BACKGROUND OF THE INVENTION

1. Field of the Invention

The present invention relates to a voltage controlled oscillator usable for, for example, generating a local oscillation signal of a wireless communication apparatus, and a PLL circuit and a wireless communication apparatus using the same.

2. Description of the Background Art

A voltage controlled oscillator (VCO) is widely used as a device for generating a local oscillation signal of a wireless communication apparatus. FIG. 15 shows an exemplary structure of a conventional voltage controlled oscillator 600. The conventional voltage controlled oscillator 600 includes inductors 601 and 602, variable capacitance elements 611 and 612, oscillating transistors 603 and 604, a current source 605 and a power supply terminal 606 that receives a voltage Vdd.

The inductors 601 and 602 and the variable capacitance elements 611 and 612 form a parallel resonance circuit. A capacitance value of the variable capacitance elements 611 and 612 changes in accordance with the voltage difference between both of two terminals thereof. Namely, the capacitance value of the variable capacitance elements 611 and 612 changes in accordance with a control voltage Vt applied to a frequency control terminal 607 from an external circuit; and as a result, the resonance frequency of the parallel resonance circuit changes. The oscillation frequency of the conventional voltage controlled oscillator 600 is in the vicinity of the resonance frequency of the parallel resonance circuit. Therefore, the oscillation frequency of the voltage controlled oscillator 600 can be controlled to be a desired value by adjusting the control voltage Vt. The oscillating transistors 603 and 604 are provided for generating a negative resistance to cancel the loss caused by a parasitic resistance component of the parallel resonance circuit and thus to fulfill the oscillation conditions.

The relationship between the control voltage Vt and the oscillation frequency of the conventional voltage controlled oscillator 600 is substantially determined by the characteristics of the variable capacitance elements 611 and 612. Hence, it is desirable that the variable capacitance elements 611 and 612 have a capacitance value which gradually changes over a wide range of control voltage Vt. In other words, it is desirable that the oscillation frequency linearly changes over a wide range of control voltage Vt.

The reason is as follows. When a PLL (phase locked loop) circuit is structured using the conventional voltage controlled circuit 600, the transient response characteristic and the noise band characteristic of the PLL circuit depend on the frequency sensitivity (the ratio of an oscillation frequency change with respect to the control voltage Vt). Therefore, if the frequency sensitivity changes in accordance with the frequency (if the frequency nonlinearly changes), the characteristics of the PLL circuit per se change in accordance with the frequency. In an area where the frequency sensitivity with respect to the control voltage Vt is high, there is a problem that the frequency is changed even by slight noise applied to the frequency control terminal 607, and thus the phase noise characteristic is lowered.

In actuality, however, it is difficult to use variable capacitance elements having a high level of linearity as the variable capacitance elements 611 and 612 in the conventional voltage controlled oscillator 600 formed on a semiconductor substrate. The reason is that it is costly to introduce a special process in order tot form such variable capacitance elements 611 and 612. FIG. 16A shows an exemplary structure of a variable capacitance element using a gate capacitance, which is widely used in CMOS process. FIG. 16B shows a change in the gate capacitance when a reference voltage Vref is applied to a gate of a MOS transistor and a control voltage Vt is applied to a drain and a source of the MOS transistor.

As shown here, in a variable capacitance element using a gate capacitance of a generally used MOS transistor, the capacitance value rapidly changes in the vicinity of a threshold voltage (voltage Vth in FIG. 16B). Therefore, the oscillation frequency also rapidly changes in the vicinity of the threshold voltage. As a result, a PLL circuit including the conventional voltage controlled oscillator 600 has a problem that the transient response characteristic and the noise band characteristic significantly change in accordance with the frequency.

In order to solve the above-described problems, voltage controlled oscillators 700 and 800 are conventionally proposed, in which the linearity of the variable capacitance elements is improved (see, for example, Japanese Laid-Open Patent Publications Nos. 2004-147310 and 2001-352218). FIG. 17 and FIG. 18 respectively show exemplary structures of the conventional voltage controlled oscillators 700 and 800. In FIG. 17 and FIG. 18, substantially identical components to those of FIG. 15 bear the identical reference numerals thereto, and detailed descriptions thereof will be omitted. Since the conventional voltage controlled oscillators 700 and 800 basically operate in the same manner, the conventional voltage controlled oscillator 700 will be described as a representative example.

The conventional voltage controlled oscillator 700 includes a power supply terminal 606 that receives a voltage Vdd, inductors 601 and 602, oscillating transistors 603 and 604, a current source 605, a reference voltage generation section 708, variable capacitance elements 711, 712, 721, 722, 731 and 732, DC cutting capacitive elements 713, 714, 723, 724, 733 and 734, and radio frequency inhibiting resistors 715, 716, 725, 726, 735 and 736.

The variable capacitance elements 711 and 712 and the DC cutting capacitive elements 713 and 714 form a first variable capacitance circuit 710. The variable capacitance elements 721 and 722 and the DC cutting capacitive elements 723 and 724 form a second variable capacitance circuit 720. The variable capacitance elements 731 and 732 and the DC cutting capacitive elements 733 and 734 form a third variable capacitance circuit 730. The capacitance value of the variable capacitance elements 711, 712, 722, 723, 731 and 732 changes in accordance with the reference voltage input to a connection point B of the respective variable capacitance element and the corresponding DC cutting capacitive element and also in accordance with the control voltage Vt applied to the frequency control terminal 607. As a result, the resonance frequency of the parallel resonance circuit changes.

The reference voltage generation circuit 708 controls an output thereof such that the reference voltages which are input to the variable capacitance circuits 710, 720 and 730 are respectively Vref, Vref−Vd and Vref−2Vd. At this point, the characteristics of the variable capacitance circuits 710, 720 and 730 with respect to the control voltage are shifted by the level of a voltage Vdd as shown in FIG. 19. The capacitance value of the parallel resonance circuit, which is a total capacitance value of the three variable capacitance circuits 710, 720 and 730, gradually changes with respect to the control voltage Vt as represented with the one-dot chain line in FIG. 19.

However, the above-described conventional voltage controlled oscillators 700 and 800 need to use a plurality of variable capacitance circuits in order to allow the capacitance value to be changed gradually with respect to the control voltage Vt. In order to allow the capacitance value to be changed gradually over a wider range of control voltage Vt, the number of variable capacitance circuits arranged in parallel needs to be increased. This involves a problem of enlarging the chip area. In addition, since it is difficult to lay out a large number of variable capacitance circuits in parallel on a semiconductor substrate, there is a limit on the number of the variable capacitance circuits. Thus, it is still difficult to allow the capacitance value to be changed gradually over a wide range of control voltage Vt.

SUMMARY OF THE INVENTION

Therefore, an object of the present invention is to provide a voltage controlled oscillator for allowing a capacitance value to be changed gradually over a wide range of control voltage without enlarging the chip area, so as to increase the linearity of the change ratio of the oscillation frequency with respect to the control voltage, and a PLL circuit and a wireless communication apparatus using such a voltage controlled oscillator.

The present invention is directed to a voltage controlled oscillator for oscillating a radio frequency signal, and a PLL circuit and a wireless communication apparatus using such a voltage controlled oscillator. In order to attain the above-described object, a voltage controlled oscillator according to the present invention comprises an inductor circuit including an inductor; a variable capacitance circuit including a variable capacitance element for changing a capacitance value in accordance with a voltage difference between both of two terminals thereof and a capacitive element, for cutting a DC component, connected to the variable capacitance element, the variable capacitance circuit being connected in parallel to the inductor circuit; a negative resistance circuit for cancelling a loss caused by a parasitic resistance component of a parallel resonance circuit including the inductor circuit and the variable capacitance circuit; and a time-switched level shift circuit for shifting a reference voltage or a voltage to be output to two or more different levels in accordance with time.

One of the two terminals of the variable capacitance element is supplied with a control voltage for controlling an oscillation frequency, and the other terminal of the variable capacitance element is supplied with a reference voltage which is output from the time-switched level shift circuit. Alternatively, one of the two terminals of the variable capacitance element is supplied with a control voltage for controlling an oscillation frequency and a voltage which is output from the time-switched level shift circuit, and the other terminal of the variable capacitance element is supplied with a fixed reference voltage. In the latter case, it is possible to eliminate the capacitive element.

It is preferable that the time-switched level shift circuit performs the control of continuously increasing a level of the reference voltage or the voltage from a minimum level to a maximum level, and continuously decreasing the level of the reference voltage or the voltage from the maximum level to the minimum level, or the control of randomly changing a level of the reference voltage or the voltage. It is preferable that the two or more levels of the reference voltage or the voltage provided by the time-switched level shift circuit are set such that all the voltage differences between each adjacent levels are the same, or such that at least one of the voltage differences between each adjacent levels is different from the rest of the voltage differences. In either case, it is preferable that the time-switched level shift circuit shifts the reference voltage or the voltage to be output to the two or more levels such that the levels appear at an identical ratio or a different ratio in a predetermined period.

A typical time-switched level shift circuit is formed using either a digital-analog converter, a digital-analog converter, a delta-sigma modulation circuit, or a combination of a delta-sigma modulation circuit and a low pass filter.

The present invention realizes a voltage controlled oscillator for allowing a capacitance value to be gradually changed over a wide range of control voltage without enlarging the chip area, so as to increase the linearity of the change ratio in the oscillation frequency with respect to the control voltage, and a PLL circuit and a wireless communication apparatus using such a voltage controlled oscillator.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4C, FIG. 4F and FIG. 4I show the relationship between the capacitance value and the frequency in FIG. 4A, FIG. 4D and FIG. 4G, respectively;

DESCRIPTION OF THE PREFERRED EMBODIMENTS

Hereinafter, embodiments of the present invention will be described with reference to the drawings.

First Embodiment

Figure 1:
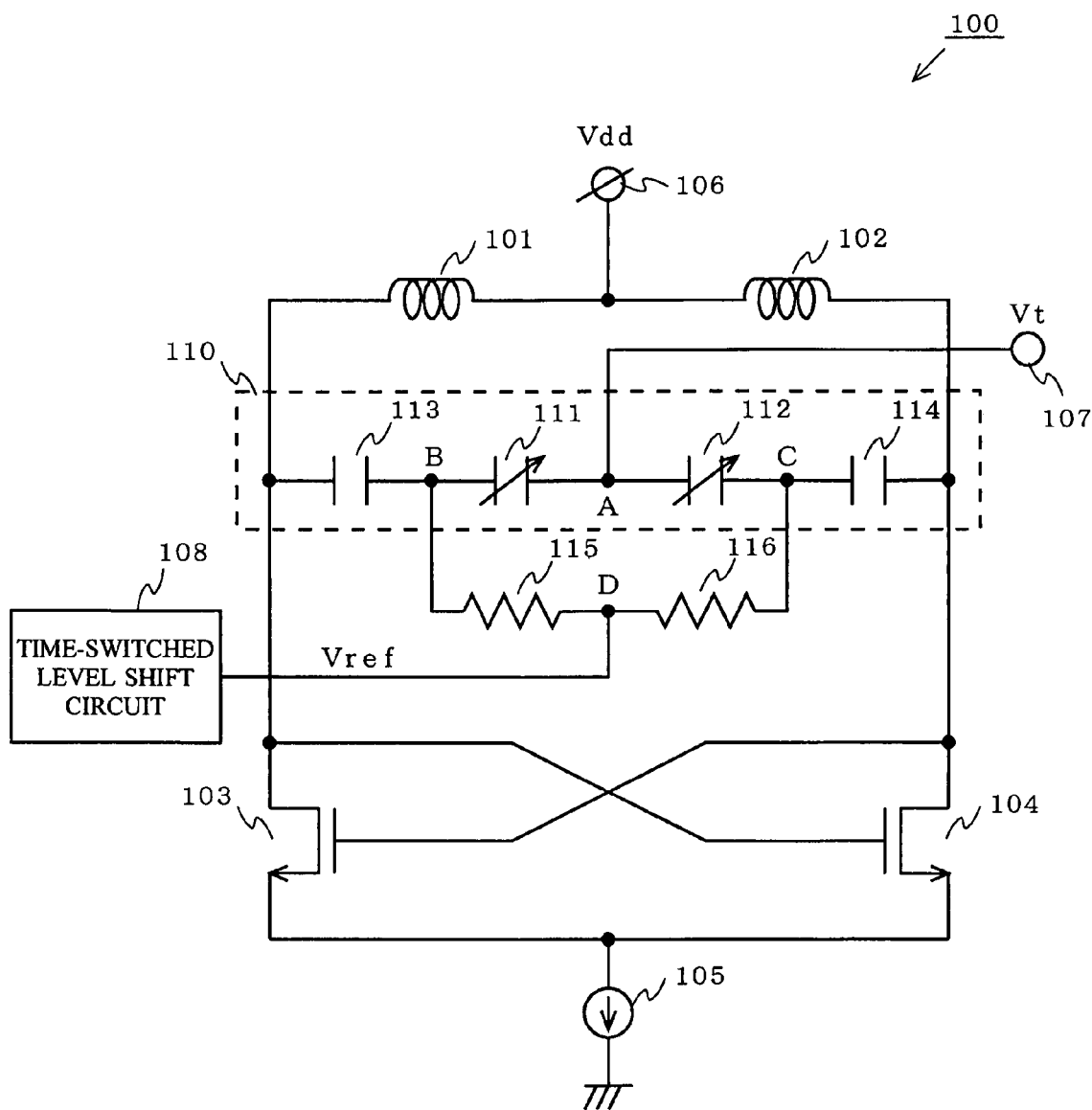
FIG. 1 shows a structure of a voltage controlled oscillator 100 according to a first embodiment of the present invention.

FIG. 1 shows a structure of a voltage controlled oscillator 100 according to a first embodiment of the present invention. As shown in FIG. 1, the voltage controlled oscillator 100 according to the first embodiment includes inductors 101 and 102, oscillating transistors 103 and 104, a current source 105, a time-switched level shift circuit 108, variable capacitance elements 111 and 112, DC cutting capacitive elements 113 and 114, and radio frequency inhibiting resistors 115 and 116.

The inductors 101 and 102 are connected to each other in series to form an inductor circuit. The oscillating transistors 103 and 104 are cross-coupled to each other to form a negative resistance circuit. As the oscillating transistors 103 and 104, MOS transistors or bipolar transistors are suitable. The variable capacitance elements 111 and 112 and the DC cutting capacitive elements 113 and 114 form a variable capacitance circuit 110 by the following connections. The variable capacitance elements 111 and 112 are connected to each other in series at a connection point A. The DC cutting capacitive elements 113 and 114, which are for cutting a DC component, are connected to the variable capacitance elements 111 and 112 in series at connection points B and C, respectively. The connection points B and C are two terminals of the series circuit formed of the variable capacitance elements 111 and 112. The series circuit formed of the variable capacitance elements 111 and 112 (between the points B and C) is connected in parallel to a series circuit formed of the radio frequency inhibiting resistors 115 and 116.

In the voltage controlled oscillator 100 according to the first embodiment of the present invention, the inductor circuit, the negative resistance circuit, and the variable capacitance circuit 110 described above are connected to one another in parallel. The inductor circuit and the variable capacitance circuit 110 form a parallel resonance circuit of the voltage controlled oscillator 100.

The connection point A of the variable capacitance elements 111 and 112 is supplied with a control voltage Vt from a frequency control terminal 107. A connection point D of the radio frequency inhibiting resistors 115 and 116 is supplied with a reference voltage Vref from the time-switched level shift circuit 108. A connection point of the inductors 101 and 102 is supplied with a power supply Vdd from a power supply terminal 106. A source of the oscillating transistor 103 and a source of the oscillating transistor 104 are commonly connected and grounded via the current source 105.

Figure 2A:
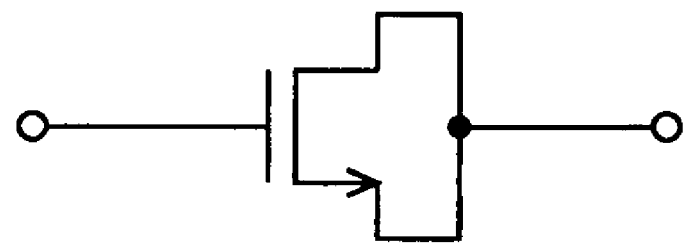
FIG. 2A through FIG. 2C show exemplary specific structures of variable capacitance elements 111 and 112.
Figure 2B:
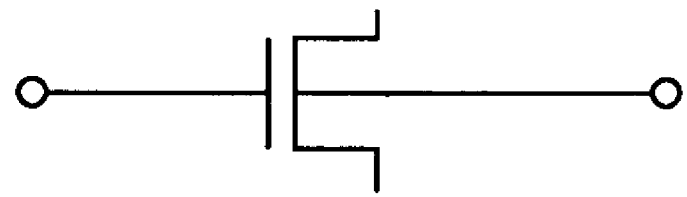
Figure 2C:
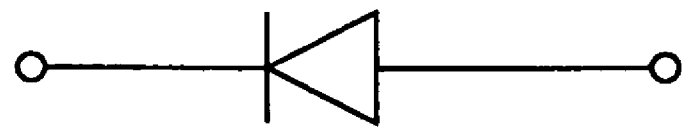

As each of the variable capacitance elements 111 and 112, an element shown in FIG. 2A through FIG. 2C is suitable, for example. FIG. 2A shows a variable capacitance element using a gate capacitance used in CMOS process. A control voltage Vt supplied from the frequency control terminal 107 is applied to either a gate side or a drain-source common connection side. FIG. 2B also shows a variable capacitance element using a gate capacitance used in CMOS process. A control voltage Vt is applied to either a gate side or a back-gate side. FIG. 2C shows a PN varactor diode.

Figure 3A:
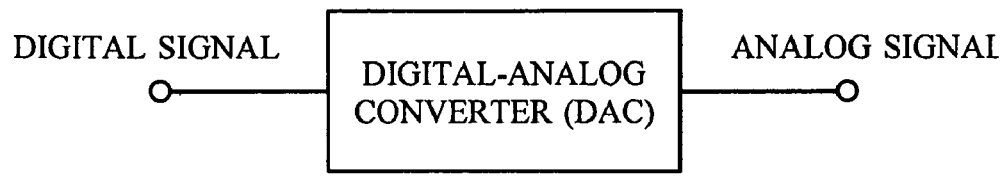
FIG. 3A through FIG. 3C show exemplary specific structures of a time-switched level shift circuit 108.
Figure 3B:
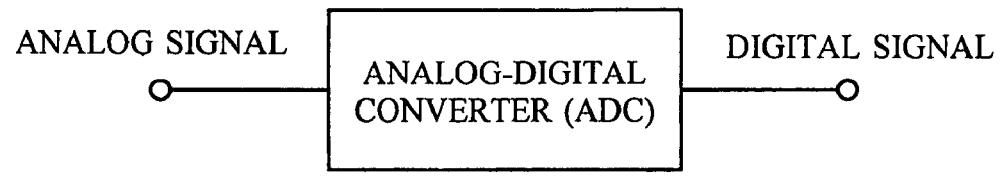
Figure 3C:
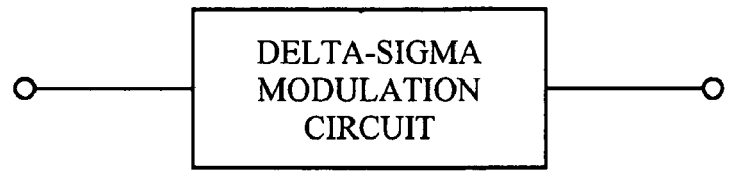

The time-switched level shift circuit 108 supplies a voltage value changing in accordance with time as the reference voltage Vref to the radio frequency inhibiting resistors 115 and 116. The time-switched level shift circuit 108 is structured using, for example, a current addition-type or integration-type digital-analog converter (DAC) shown in FIG. 3A, a sequential comparison-type or integration-type analog-digital converter (ADC) shown in FIG. 3B, or a delta-sigma modulation circuit shown in FIG. 3C.

Now, an operation of the voltage controlled oscillator 100 having the above structure according to the first embodiment of the present invention will be described.

In the voltage controlled oscillator 100 shown in FIG. 1, where the inductance of the inductor 101 is L, the capacitance value of the variable capacitance elements 111 and 112 is C1, and the capacitance value of the DC cutting capacitive elements 113 and 114 is C2, the common frequency f0 of the parallel resonance circuit is expressed by the following expression [1]. In expression [1], C'=C1·C2/(C1+C2).

$$f0 = 1/(2\pi\sqrt{(2L \cdot C'/2)}) \qquad [1]$$
$$= 1/(2\pi\sqrt{(L \cdot C')})$$

The variable capacitance circuit 110 operates as follows. The capacitance value C1 of the variable capacitance element 111 is changed in accordance with the voltage difference between the control voltage Vt supplied to the connection point A and the reference voltage Vref applied to the connection point B, i.e., in accordance with the difference between the voltages applied to both of two terminals of the variable capacitance element 111. The capacitance value C1 of the variable capacitance element 112 is changed in accordance with the voltage difference between the control voltage Vt supplied to the connection point A and the reference voltage Vref applied to the connection point C, i.e., in accordance with the difference between the voltages applied to both of two terminals of the variable capacitance element 112. As a result, the resonance frequency f0 of the parallel resonance circuit is changed.

Figure 4A:
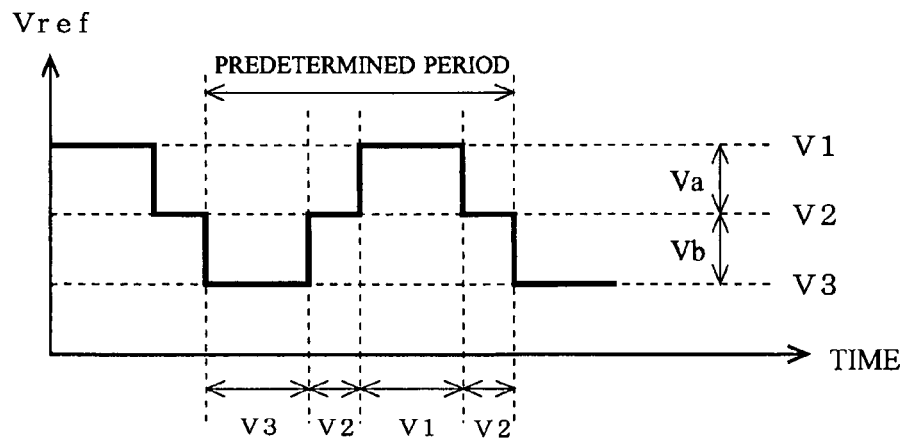
FIG. 4A, FIG. 4D and FIG. 4G show examples of a reference voltage Vref which is output from the time-switched level shift circuit 108.

The time-switched level shift circuit 108 changes the reference voltage Vref to be output to a plurality of values in accordance with time, in order to control the capacitance value of the variable capacitance elements 111 and 112 such that the resonance frequency f0 is linearly changed over a wide range of control voltage. For example, the time-switched level shift circuit 108 formed of a digital-analog converter (DAC) or an analog-digital converter (ADC) may be used to switch the reference voltage Vref such that as shown in FIG. 4A, three voltages V1, V2 and V3 appear at the same ratio over a predetermined period.

Figure 4B:
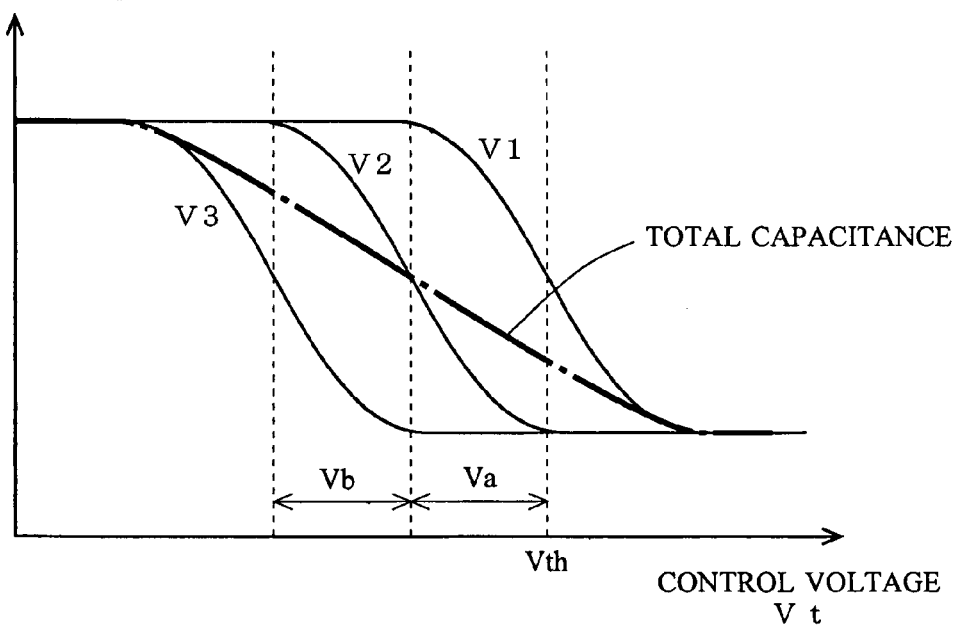
FIG. 4B, FIG. 4E and FIG. 4H show examples of a change of the capacitance value with respect to the control voltage Vt in FIG. 4A, FIG. 4D and FIG. 4G, respectively.
Figure 4C:
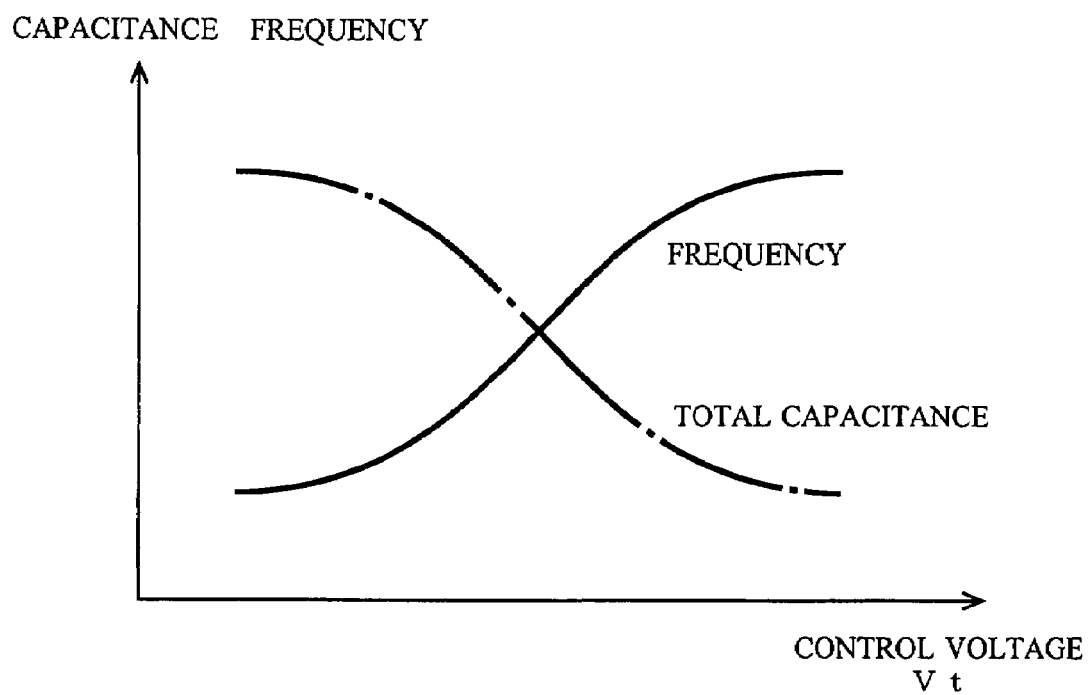

Now, it is assumed that when the reference voltage Vref is voltage V1, the capacitance value of the variable capacitance elements 111 and 112 changes in the vicinity of a control voltage of Vth. In this case, the capacitance values when the reference voltage Vref is V1, V2 and V3 change with respect to the control voltage Vt as shown in FIG. 4B. The voltages V1, V2 and V3 shifted by the level of a voltage difference Va or Vb in accordance with time are each supplied as the reference voltage Vt from the time-switched level shift circuit 108. Thus, the capacitance characteristic is shifted by Va or Vb in accordance with time. The capacitance value of the parallel resonance circuit is an average of the three variable capacitance characteristics when averaged based on time. The total capacitance value, as represented with the one-dot chain line in FIG. 4B and FIG. 4C, gradually changes linearly with respect to the control voltage Vt. As a result, the linearity of the frequency sensitivity (the ratio of the oscillating frequency change with respect to the control voltage) over a wide range of control voltage is improved.

The above expression [1] can be represented by the following expression [2] regarding the capacitance value C' of the variable capacitance circuit 110.

$$C'=1/(4\pi^2 Lf0^2) \quad [2]$$

The inductance L of expression [2] is constant. Understandably, in order to improve the linearity of the frequency sensitivity, it is desirable to change the capacitance C' of the variable capacitance circuit 110 in proportion to $1/(f0^2)$, not linearly.

Figure 4D:
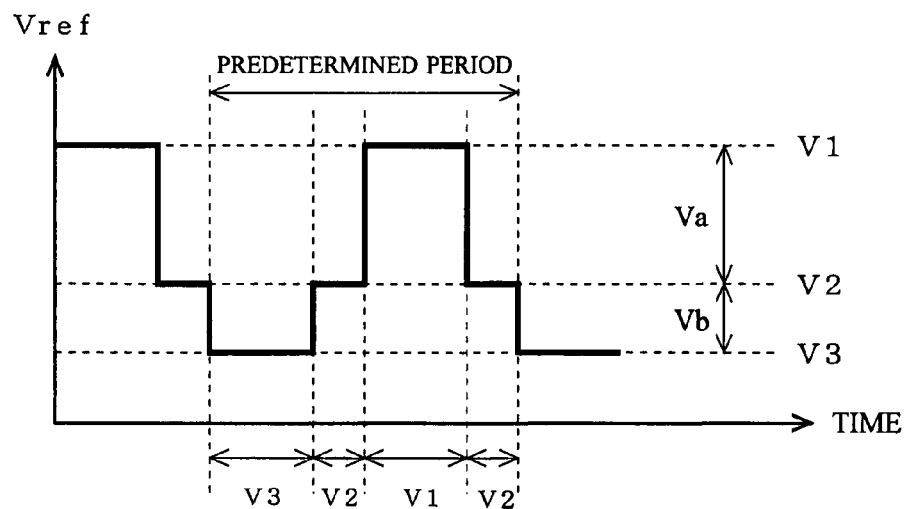
Figure 4E:
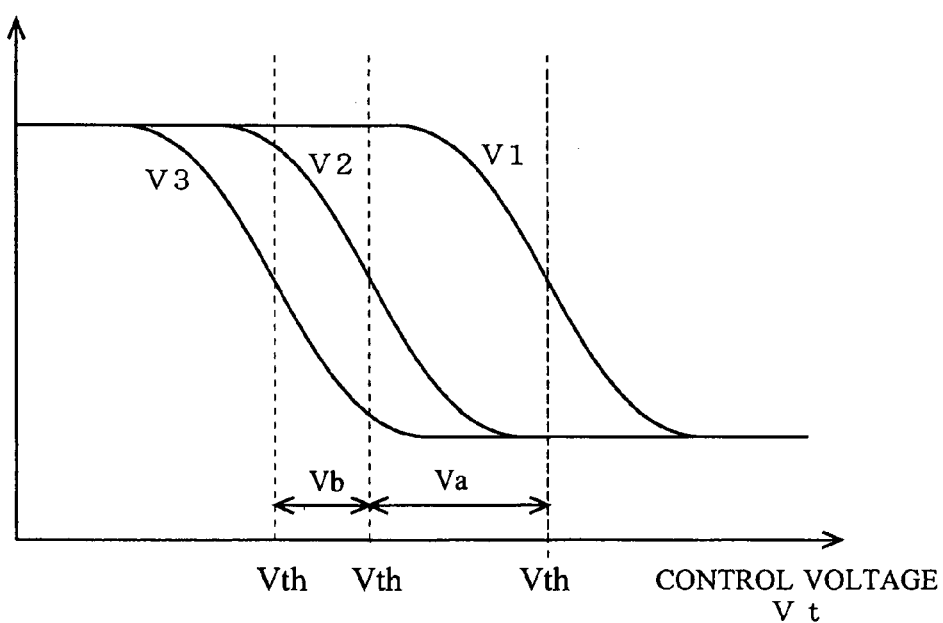
Figure 4F:
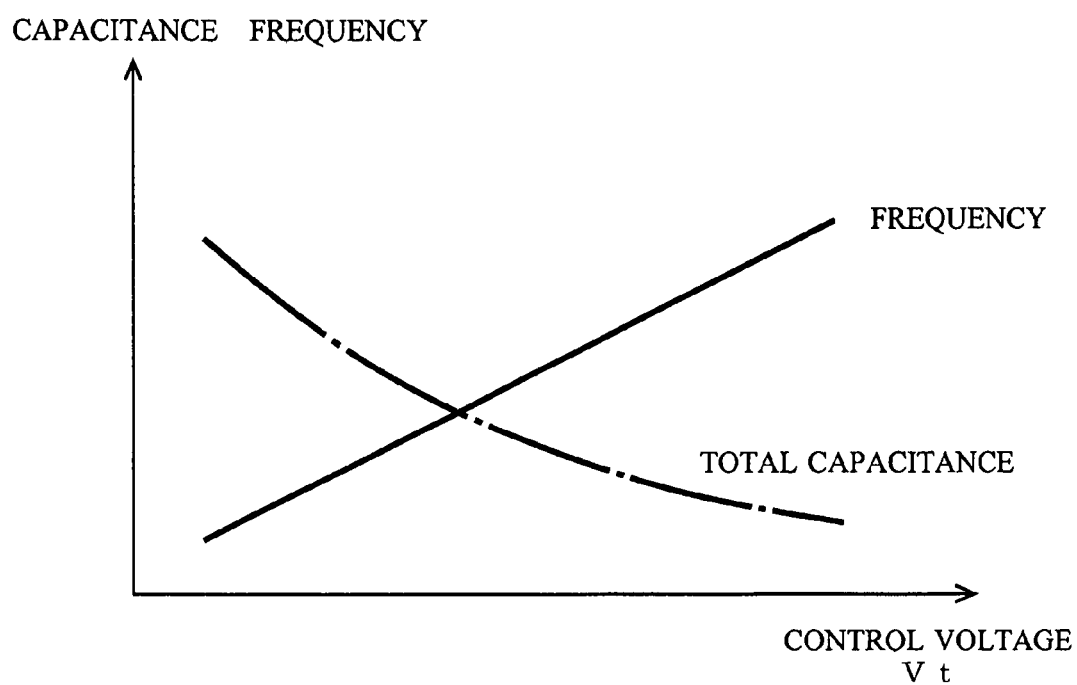

According to one conceivable technique to change the capacitance C' in proportion to $1/(f0^2)$, as shown in FIG. 4D through FIG. 4F, the voltage differences Va and Vb are set to be different while the ratios at which the reference voltage Vref is the voltage V1, V2 and V3 in the predetermined period are the same. The voltages V1, V2 and V3 with which the voltage differences Va and Vb are different can be easily obtained by, for example, using a 2-bit DAC for outputting 4-level voltages ($V_{00}<V_{01}<V_{10}<V_{11}$), in which the voltage differences between each adjacent levels are the same, and using only three of the voltages ($V_{00}$, $V_{10}$ and $V_{11}$).

Figure 4G:
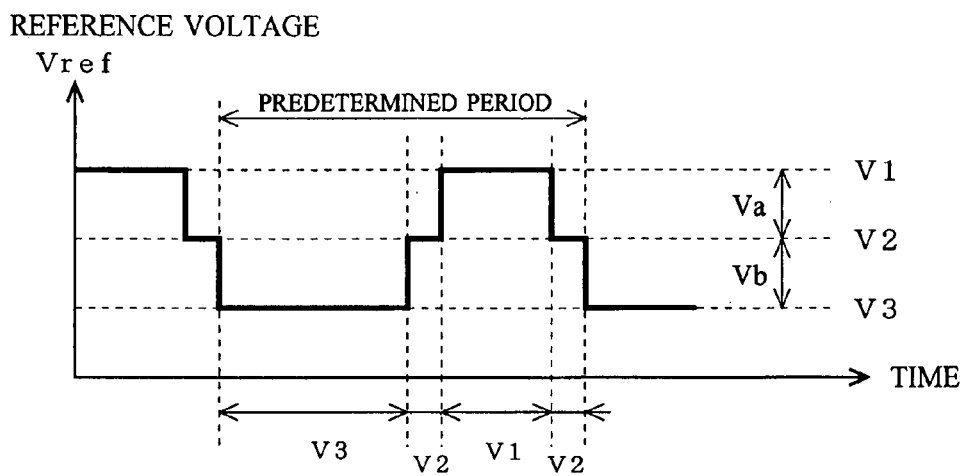
Figure 4H:
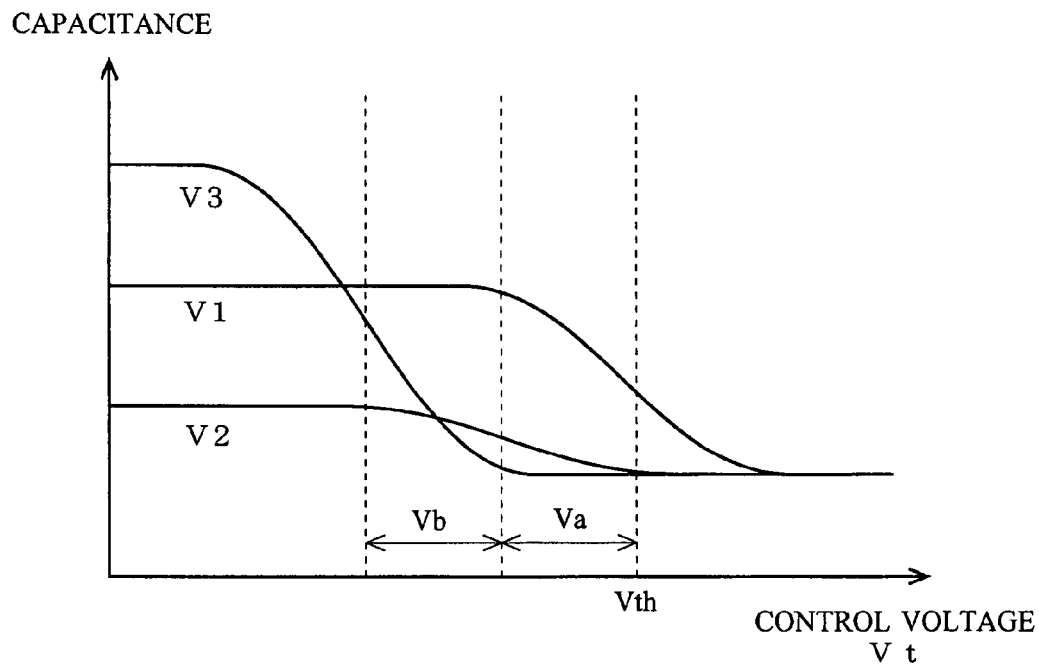
Figure 41:
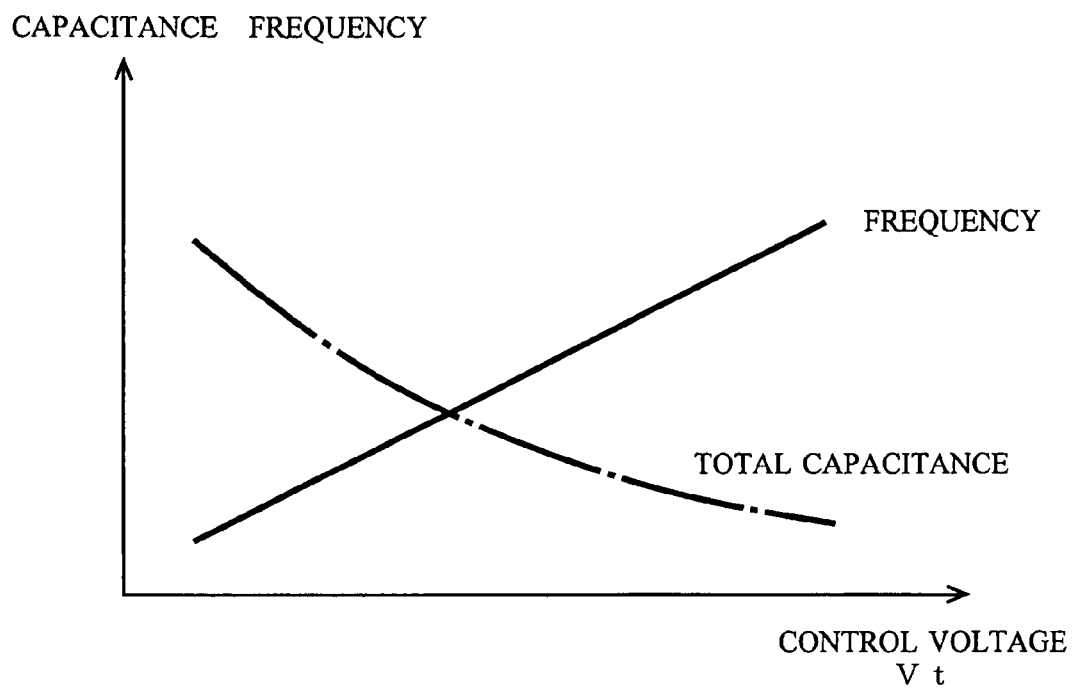

Alternatively, as shown in FIG. 4G through FIG. 4I, the ratios at which the reference voltage Vref is the voltage V1, V2 and V3 in the predetermined period may be set to be different while the voltage differences Va and Vb are the same.

Figure 5A:
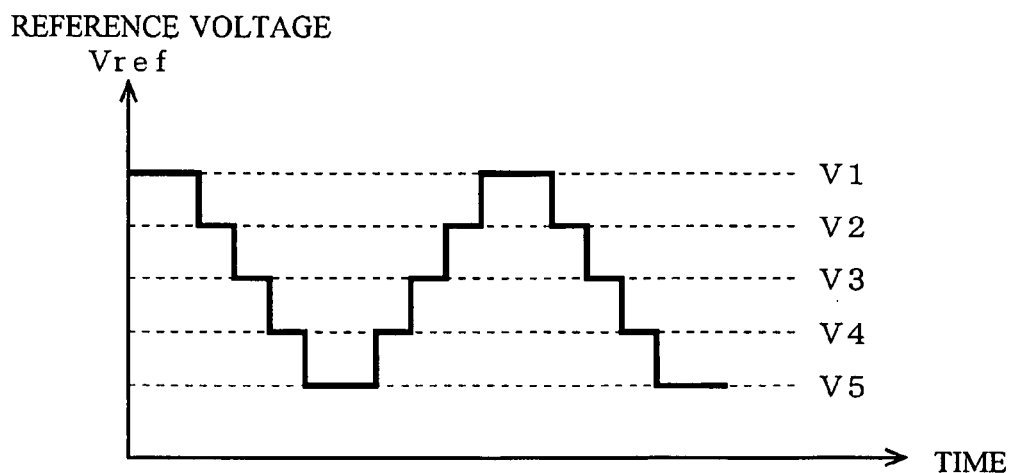
FIG. 5A and FIG. 5D show examples of a reference voltage Vref which is output from the time-switched level shift circuit 108.
Figure 5B:
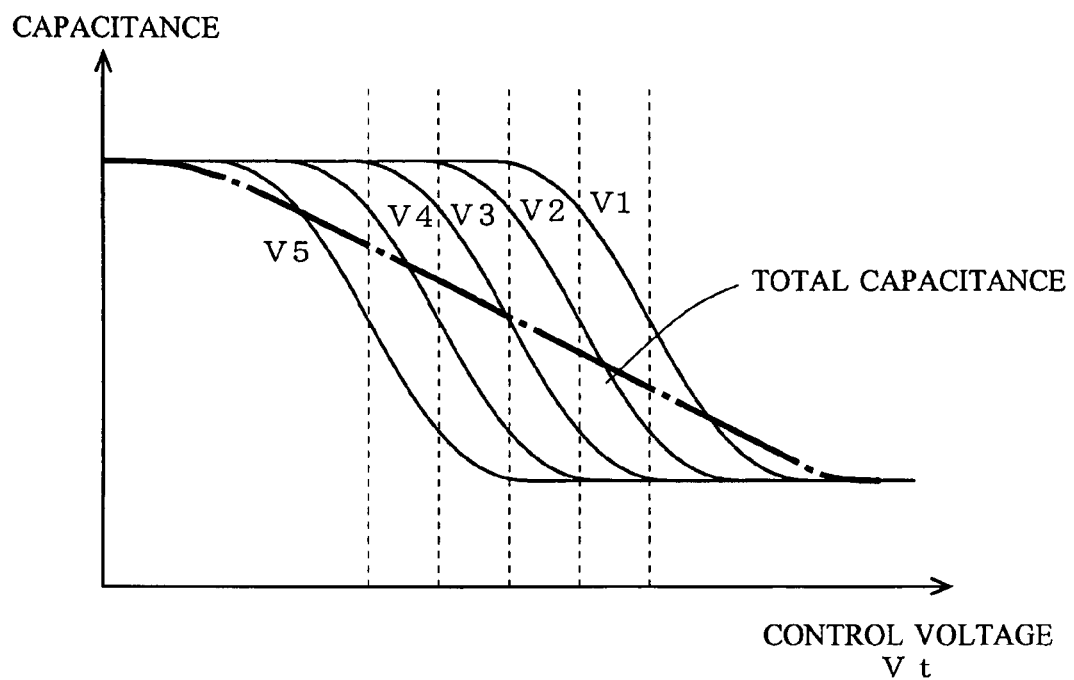
FIG. 5B shows an example of a change of the capacitance value with respect to the control voltage Vt in FIG. 5A.
Figure 5C:
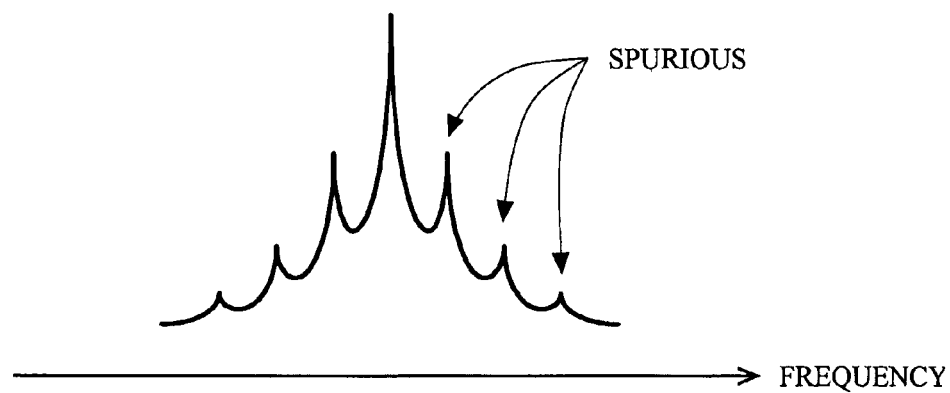
FIG. 5C shows an output spectrum of the voltage controlled oscillator 100 in FIG. 5A.
Figure 5D:
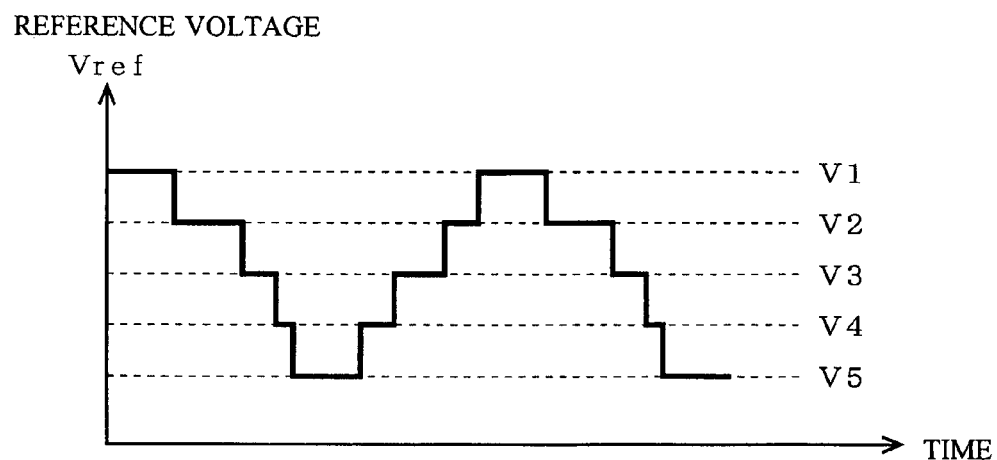

For example, as shown in FIG. 5A, the reference voltage Vref may be switched such that five voltages V1 through V5 appear at the same ratio in the predetermined period. In this case, as represented with the one-dot chain line in FIG. 5B, the total capacitance value of the parallel resonance circuit can be changed with a milder inclination than in FIG. 4B; namely, the linearity of the frequency sensitivity can be improved. Thus, as the number of voltage values among which the reference voltage Vref is shifted is increased, the linearity of the frequency sensitivity can be improved. The number of voltage values among which the reference voltage Vref is shifted can be easily increased by, for example, increasing the number of bits of the digital-analog converter (DAC) or the analog-digital converter (ADC). The number of voltage values among which the reference voltage Vref is shifted is not limited to an odd number, and may be an even number. The number of voltage values, and the voltage values per se, among which the reference voltage Vref is shifted, can be freely designed so as to fulfill the characteristics required by the voltage controlled oscillator. As shown in FIG. 5D, the reference voltage Vref may be switched such that the voltage differences between each adjacent voltages of the voltages V1 through V5 are the same and the voltages V1 through V5 appear at different ratios in the predetermined period.

In the case where a digital-analog converter (DAC) or an analog-digital converter (ADC) is used for the time-switched level shift circuit 108, the output thereof is cyclic as shown in FIG. 5A. As a result, the output spectrum of the voltage controlled converter 100 may occasionally have spurious in the vicinity of the oscillation frequency as shown in FIG. 5C.

Figure 6A:
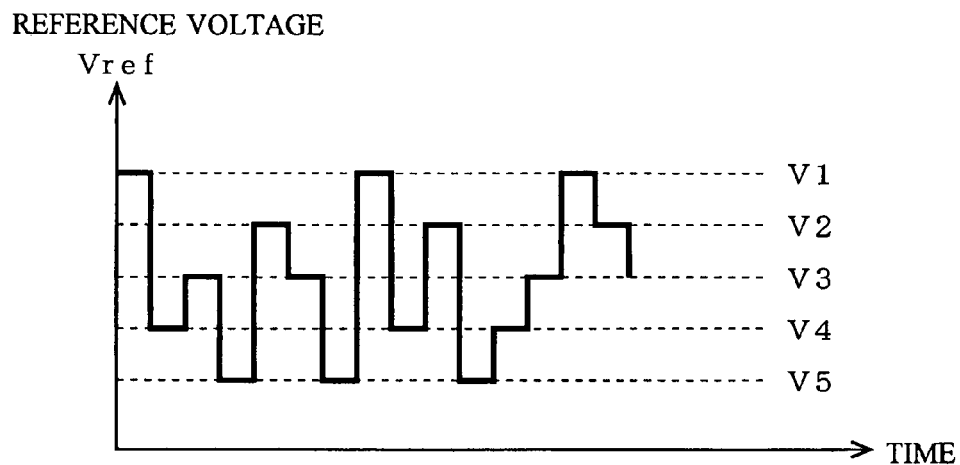
FIG. 6A and FIG. 6C show examples of a reference voltage Vref which is output from the time-switched level shift circuit 108.
Figure 6B:
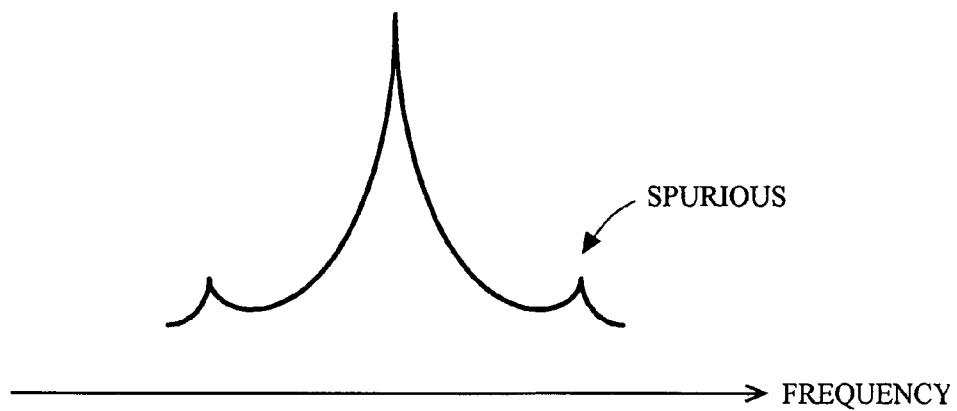
FIG. 6B shows an output spectrum of the voltage controlled oscillator 100 in FIG. 6A.
Figure 6C:
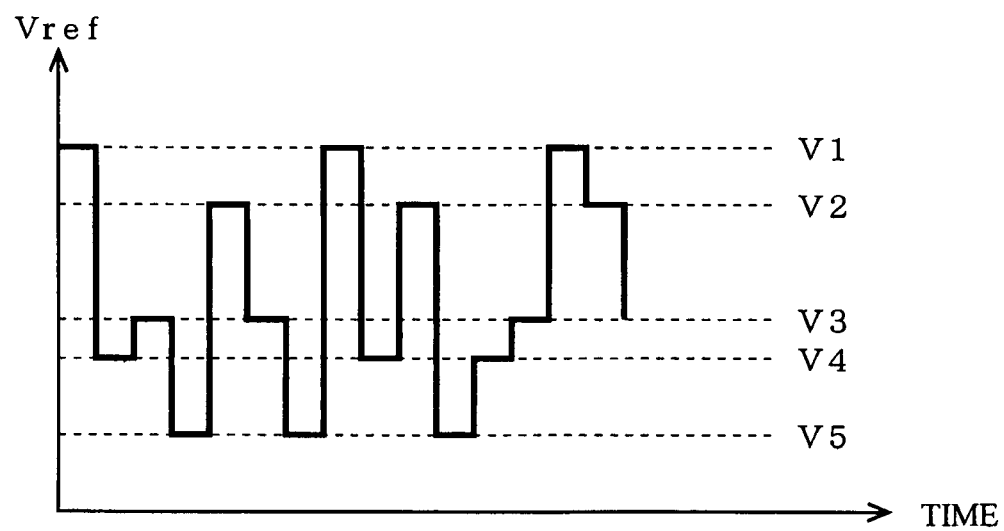

By contrast, in the case where a delta-signal modulation circuit is used for the time-switched level shift circuit 108, the voltage V1 through V5 can be generated randomly. Therefore, the output thereof is non-cyclic as shown in FIG. 6A, and thus as shown in FIG. 6B, the output spectrum of the voltage controlled converter 100 is unlikely to have spurious in the vicinity of the oscillation frequency. As shown in FIG. 6C, the reference Vref may be switched such that the voltages V1 through V5 appear at the same ratio in the predetermined period and such that all the voltage differences between each adjacent voltages of the voltages V1 through V5 are not the same.

Figure 7:
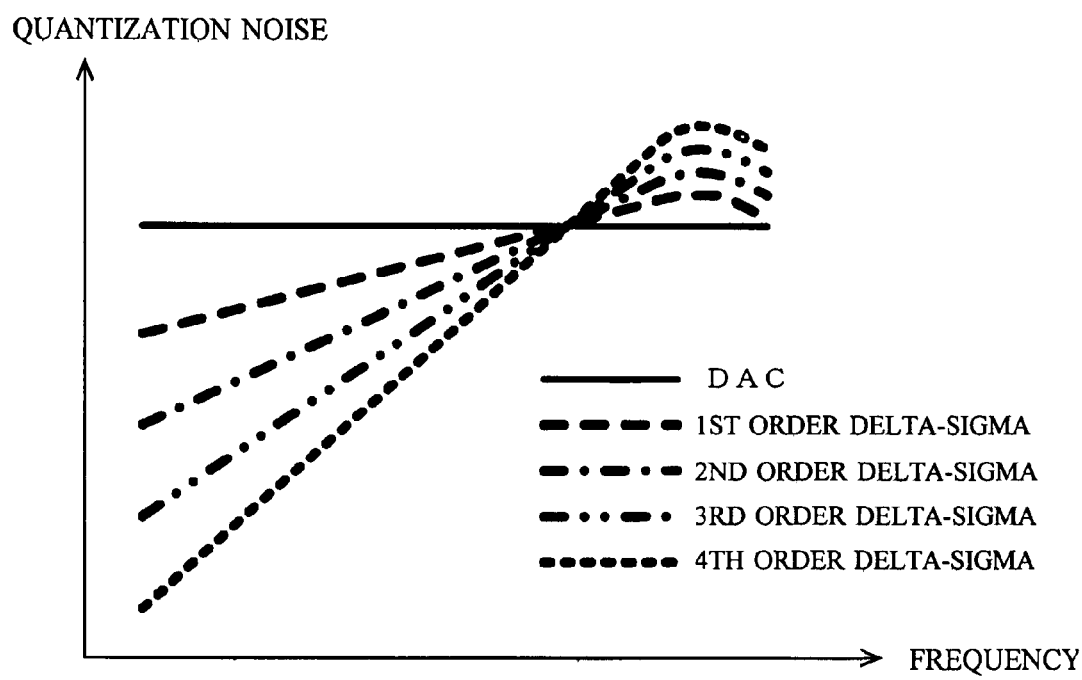
FIG. 7 shows the levels of noise which is output from the time-switched level shift circuit 108.

In the case where a digital-analog converter (DAC) or an analog-digital converter (ADC) is used for the time-switched level shift circuit 108, the output thereof includes a constant level of quantization noise with respect to the frequency as represented with the solid line in FIG. 7. As a result, the output of the voltage controlled oscillator 100 may occasionally have phase noise deteriorated in the vicinity of the oscillation frequency by the superimposed noise.

Figure 8:
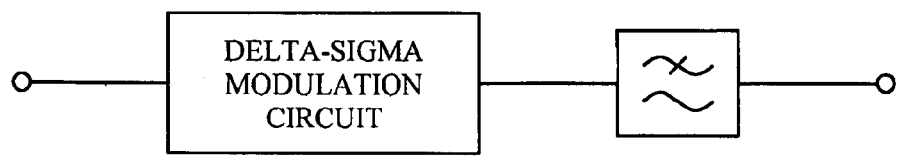
FIG. 8 shows a specific exemplary structure of the time-switched level shift circuit 108.

By contrast, in the case where a delta-signal modulation circuit is used for the time-switched level shift circuit 108, the output quantization noise is inclined with respect to the frequency as represented with the lines other than the solid line in FIG. 7 In a frequency area which is lower than that of the digital-analog converter (DAC) or the analog-digital converter (ADC), the noise is low; whereas in a frequency area which is higher than that of the digital-analog converter (DAC) or the analog-digital converter (ADC), the noise is high. As the order value of the delta-sigma modulation circuit is increased, the noise in the vicinity of the oscillation frequency is decreased. Although noise is increased in an area far from the oscillation frequency as the order value is increased, noise in such an area can be decreased by connecting a low pass filter to an output terminal of the delta-sigma modulation circuit as shown in FIG. 8. By selecting an appropriate order value, the deterioration in the phase noise of the voltage controlled oscillator 100 can be suppressed.

As described above, the voltage controlled oscillator 100 according to the first embodiment of the present invention can improve the linearity of the frequency sensitivity over a wide range of control voltage without using a plurality of variable capacitance circuits. Since the plurality of variable capacitance circuits are not used, the chip area is not enlarged and the layout is not difficult.

Second Embodiment

Figure 9:
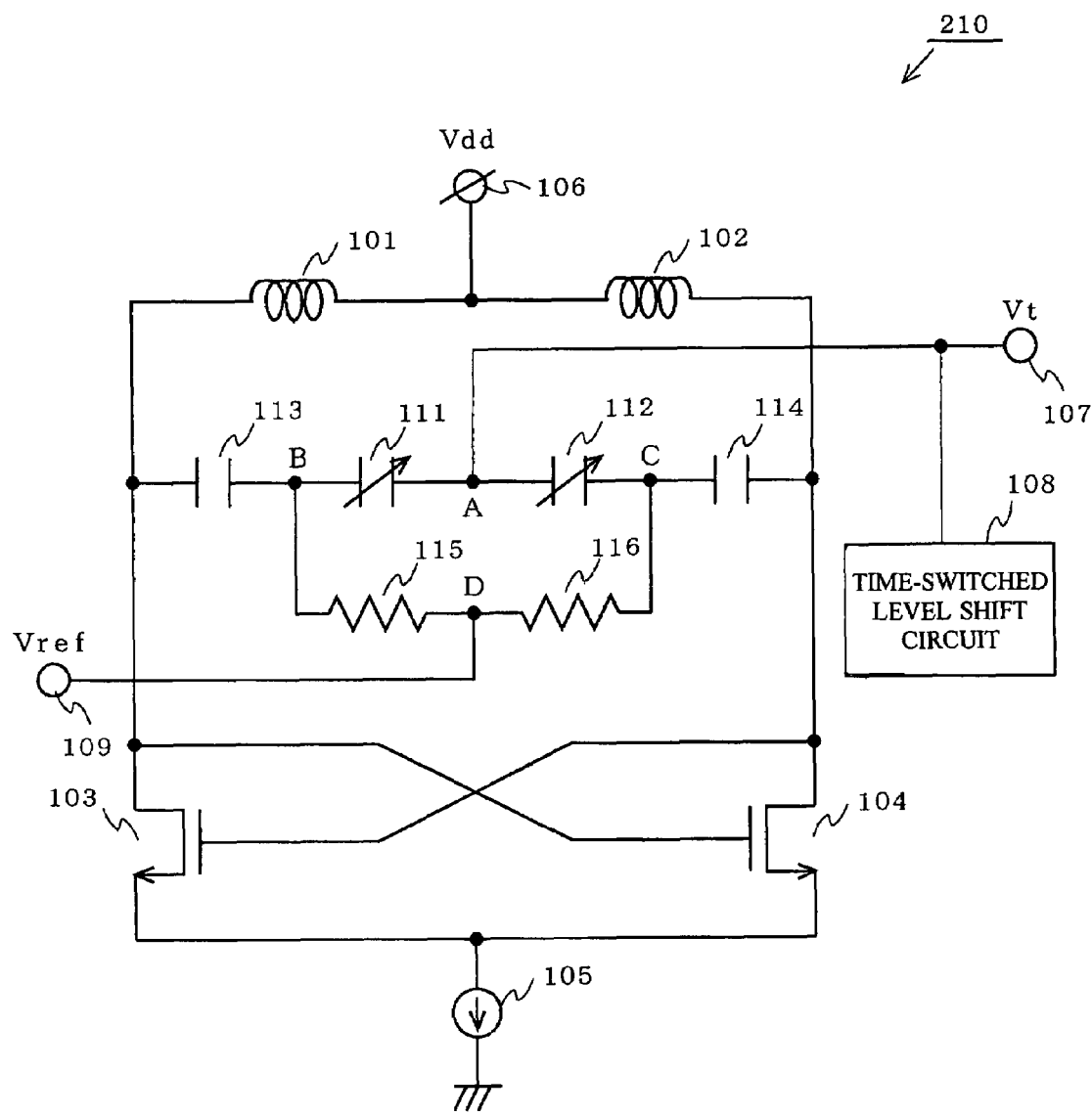
FIG. 9 and FIG. 10 respectively show structures of voltage controlled oscillators 210 and 220 according to a second embodiment of the present invention.

FIG. 9 shows a structure of a voltage controlled oscillator 210 according to a second embodiment of the present invention. As shown in FIG. 9, the voltage controlled oscillator 210 according to the second embodiment is different from the voltage controlled oscillator 100 according to the first embodiment in the position of the time-switched level shift circuit 108. The elements of the voltage controlled oscillator 210 are basically the same as those of the voltage controlled oscillator 100 described above in terms of the detailed circuit configuration and operation, and thus bear the identical reference numerals thereto and descriptions thereof will be omitted.

In the voltage controlled oscillator 210, the output terminal of the time-switched level shift circuit 108 is connected to the frequency control terminal 107. Owing to this structure, the output voltage value from the time-switched level shift circuit 108, which changes in accordance with time, is applied to the connection point A in the state of being added to the control voltage Vt. The reference voltage Vref applied to the connection point D has a fixed value. Such a fixed value can be freely set as long as the linearity of the frequency sensitivity is guaranteed. For example, the fixed value may be Vdd/2, which is half of the power supply voltage Vdd, or an intermediate value of the changing voltage which is output, by the time-switched level shift circuit 108 (voltage V2 in the example of FIG. 4A and voltage V3 in the example of FIG. 5A).

Namely, the voltage controlled oscillator 100 according to the first embodiment has the control voltage Vt at a fixed value while changing the reference voltage Vref; whereas the voltage controlled oscillator 210 according to the second embodiment has the reference voltage Vref at a fixed value while changing the control voltage Vt. Both of the voltage controlled oscillators 100 and 210 use the relative voltage difference between the control voltage Vt and the reference voltage Vref.

As described above, the voltage controlled oscillator 210 according to the second embodiment of the present invention can improve the linearity of the frequency sensitivity over a wide range of control voltage without using a plurality of variable capacitance circuits. Since the plurality of variable capacitance circuits are not used, the chip area is not enlarged and the layout is not difficult.

Figure 10:
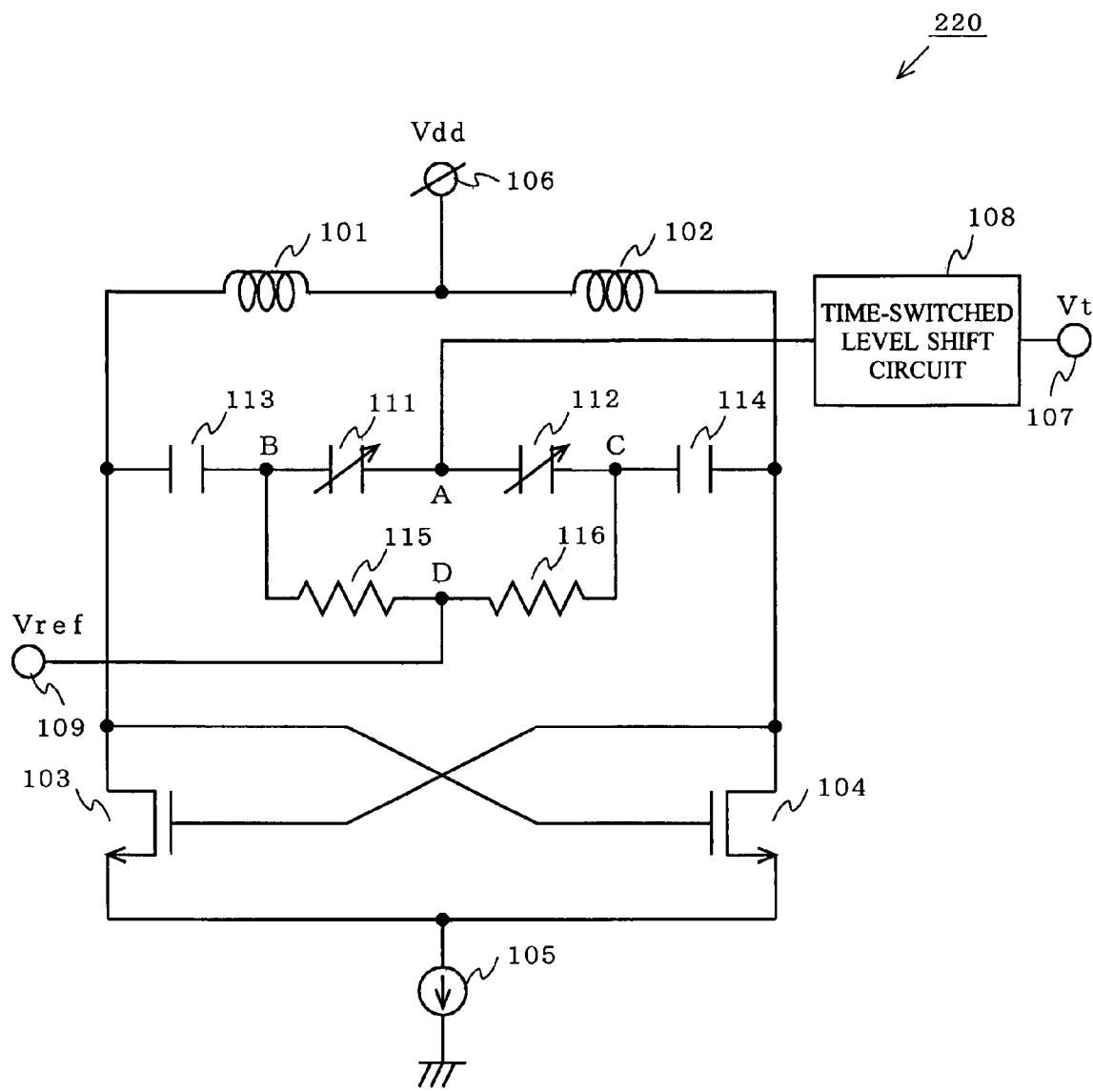

The position of the time-switched level shift circuit 108 is not limited to the position shown in FIG. 9, and may be, for example, the position in a voltage controlled oscillator 220 shown in FIG. 10.

Third Embodiment

Figure 11:
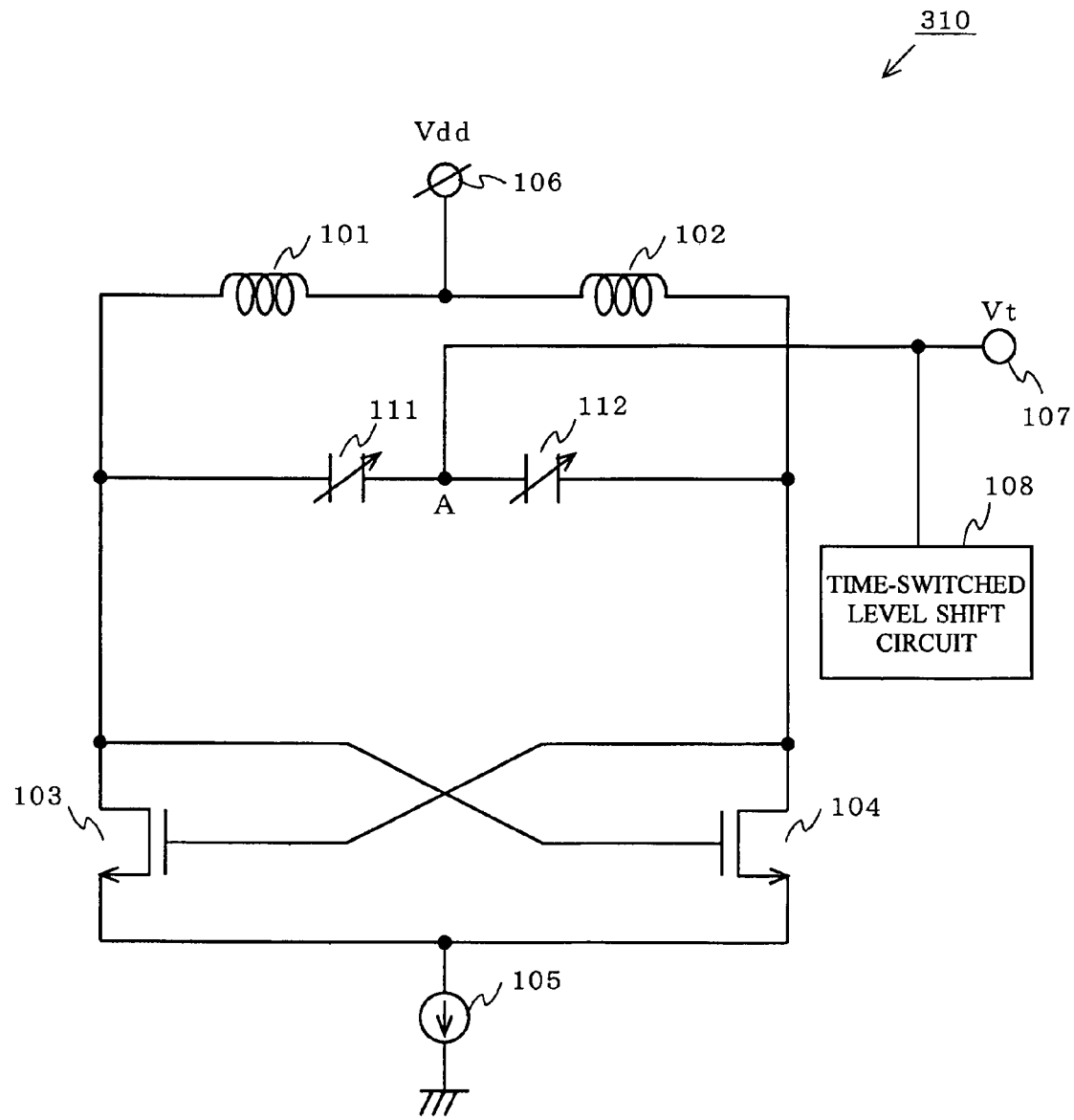
FIG. 11 and FIG. 12 respectively show structures of voltage controlled oscillators 310 and 320 according to a third embodiment of the present invention.

FIG. 11 shows a structure of a voltage controlled oscillator 310 according to a third embodiment of the present invention. As shown in FIG. 11, the voltage controlled oscillator 310 according to the third embodiment includes inductors 101 and 102, oscillating transistors 103 and 104, a current source 105, a time-switched level shift circuit 108, and variable capacitance elements 111 and 112.

The voltage controlled oscillator 310 according to the third embodiment has a structure obtained by eliminating the DC cutting capacitive elements 113 and 114 and the radio frequency inhibiting resistors 115 and 116 from the voltage controlled oscillator 210 according to the second embodiment. The elements of the voltage controlled oscillator 310 are basically the same as those of the voltage controlled oscillators 100 and 210 described above in terms of the detailed circuit configuration and operation, and thus bear the identical reference numerals thereto and descriptions thereof will be omitted.

In the voltage controlled oscillator 310, the capacitance C1 of the variable capacitance elements 111 and 112 is changed in accordance with a total voltage supplied to the connection point A which is obtained by adding the control voltage Vt and the reference voltage Vref. As a result, the resonance frequency f0 of the parallel resonance circuit is changed. The time-switched level shift circuit 108 changes the reference voltage Vref to be added to the control voltage Vt so as to change the total voltage to a plurality of values in accordance with time, in order to control the capacitance value of the variable capacitance elements 111 and 112 such that the resonance frequency f0 is linearly changed over a wide range of control voltage.

As described above, the voltage controlled oscillator 310 according to the third embodiment of the present invention can improve the linearity of the frequency sensitivity over a wide range of control voltage without using a plurality of variable capacitance circuits. Since the plurality of variable capacitance circuits are not used, the chip area is not enlarged and the layout is not difficult.

Figure 12:
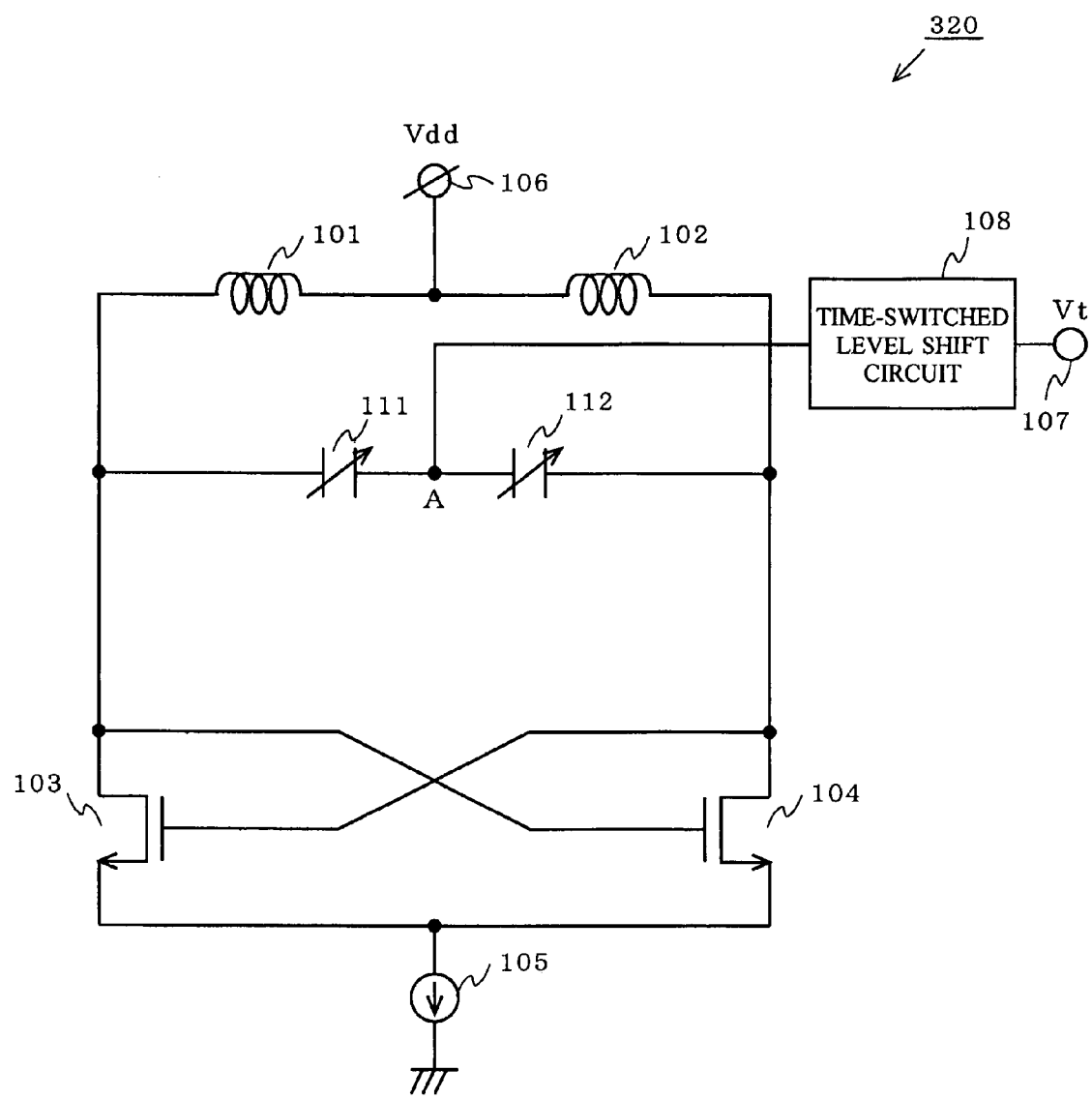

The position of the time-switched level shift circuit 108 is not limited to the position shown in FIG. 11, and may be, for example, the position in a voltage controlled oscillator 320 shown in FIG. 12.

(Exemplary Structure Including the Voltage Controlled Oscillator)

Figure 13:
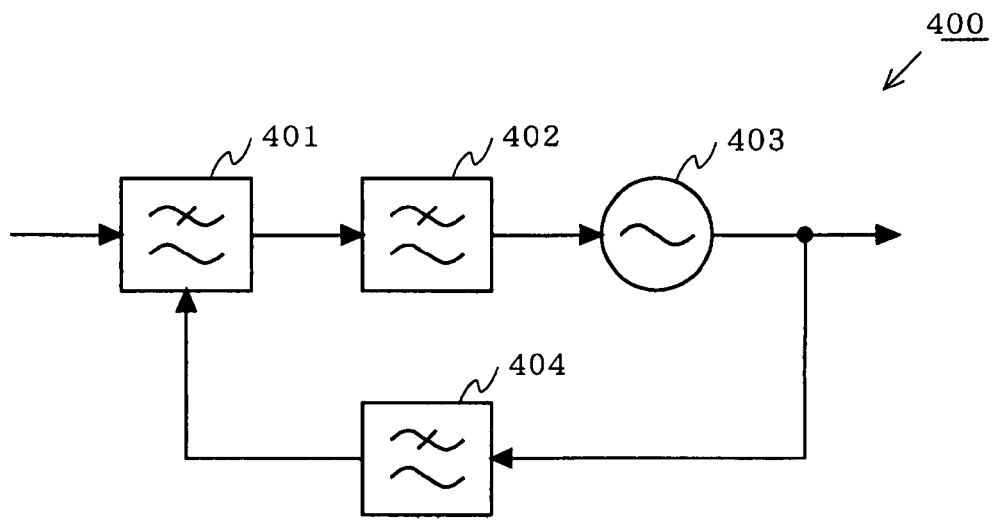
FIG. 13 shows an exemplary structure of a PLL circuit 400 using a voltage controlled oscillator according to the present invention.

FIG. 13 shows an exemplary structure of a PLL circuit 400 using any of the voltage controlled oscillators according to the first through third embodiments. As shown in FIG. 13, the PLL circuit 400 includes a phase comparator 401, a loop filter 402, a voltage controlled oscillator 403 according to the present invention, and a frequency divider 404.

The phase comparator 401 compares an input reference signal and a signal obtained by dividing an output signal from the voltage controlled oscillator 403 by the frequency divider 404. The signal which is output from the phase comparator 401 is input to a frequency control terminal 107 of the voltage controlled oscillator 403 as a control voltage Vt via the loop filter 402. The voltage controlled oscillator 403 outputs a signal of a desired frequency based on the control voltage Vt. Instead of the frequency divider 404, a mixer may be used. The frequency divider 404 and the mixer may be used together.

Figure 14:
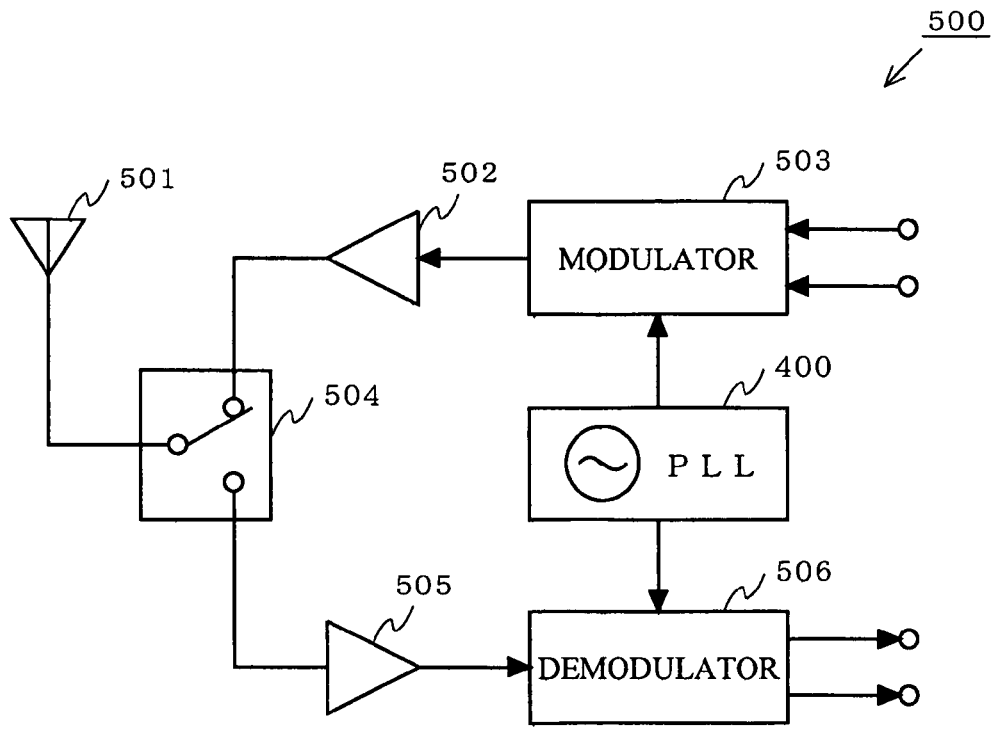
FIG. 14 shows an exemplary structure of a wireless communication apparatus 500 using a voltage controlled oscillator according to the present invention.
Figure 15:
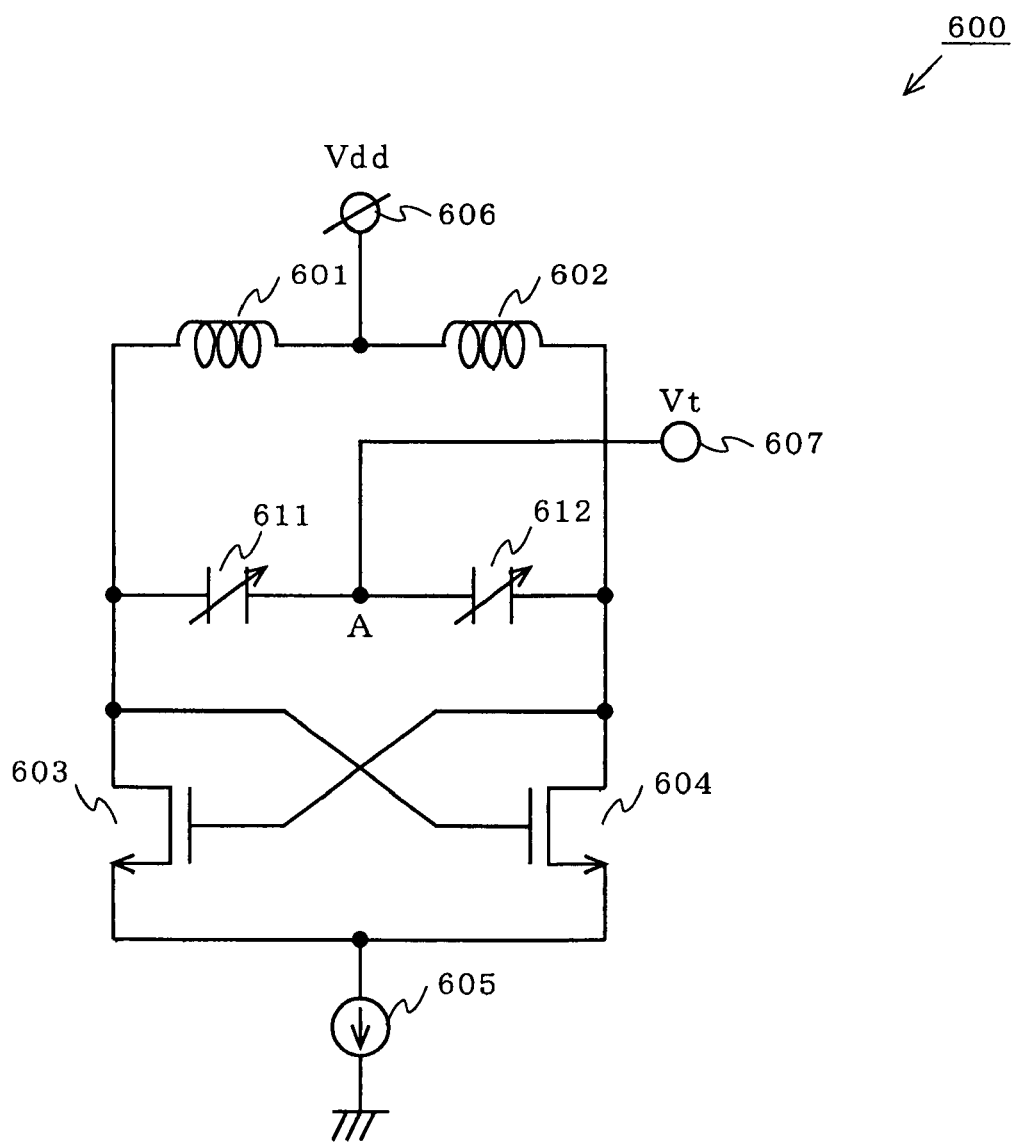
FIG. 15 shows a structure of a conventional voltage controlled oscillator 600.
Figure 16A:
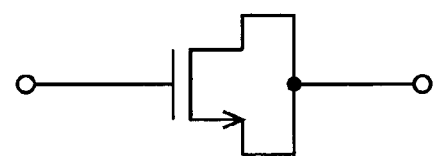
FIG. 16A shows a specific exemplary structure of variable capacitance elements 611 and 612.
Figure 16B:
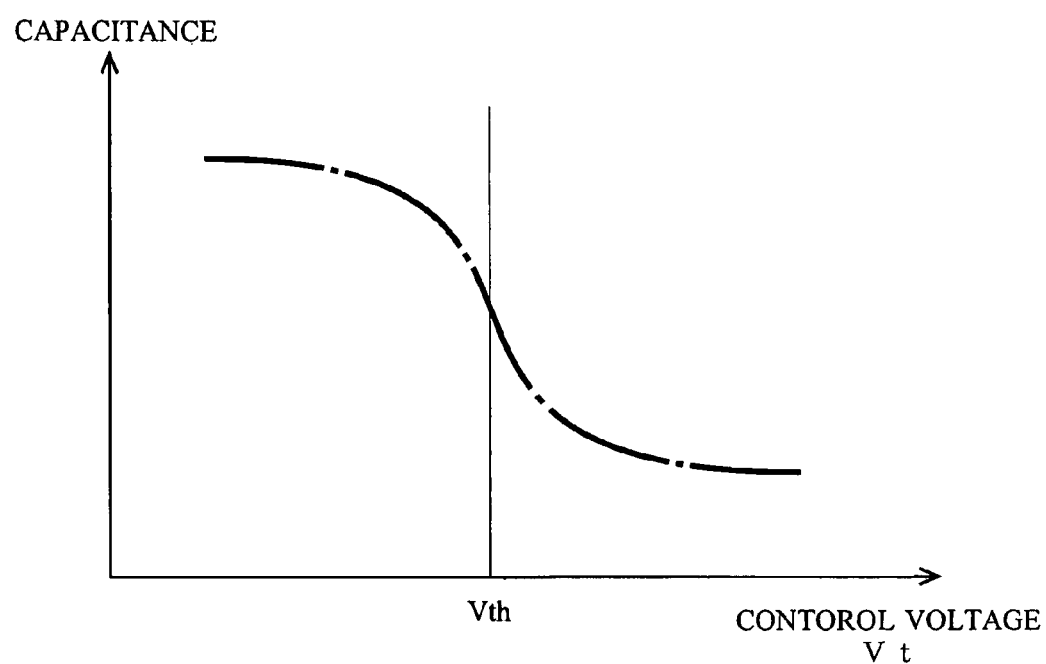
FIG. 16B shows an example of a change of the capacitance value with respect to the control voltage Vt in FIG. 15.
Figure 17:
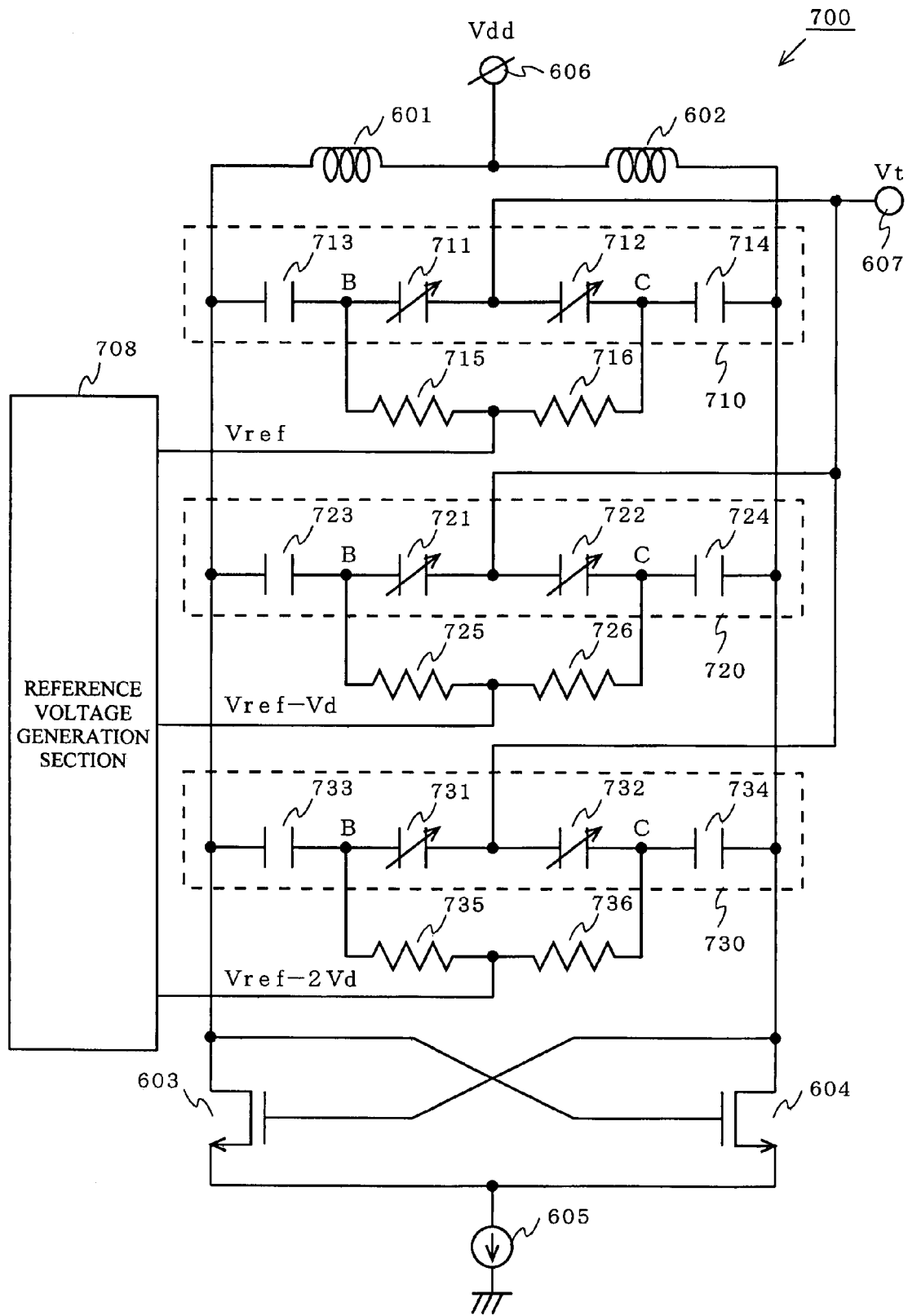
FIG. 17 and FIG. 18 respectively show structures of conventional voltage controlled oscillators 700 and 800.
Figure 18:
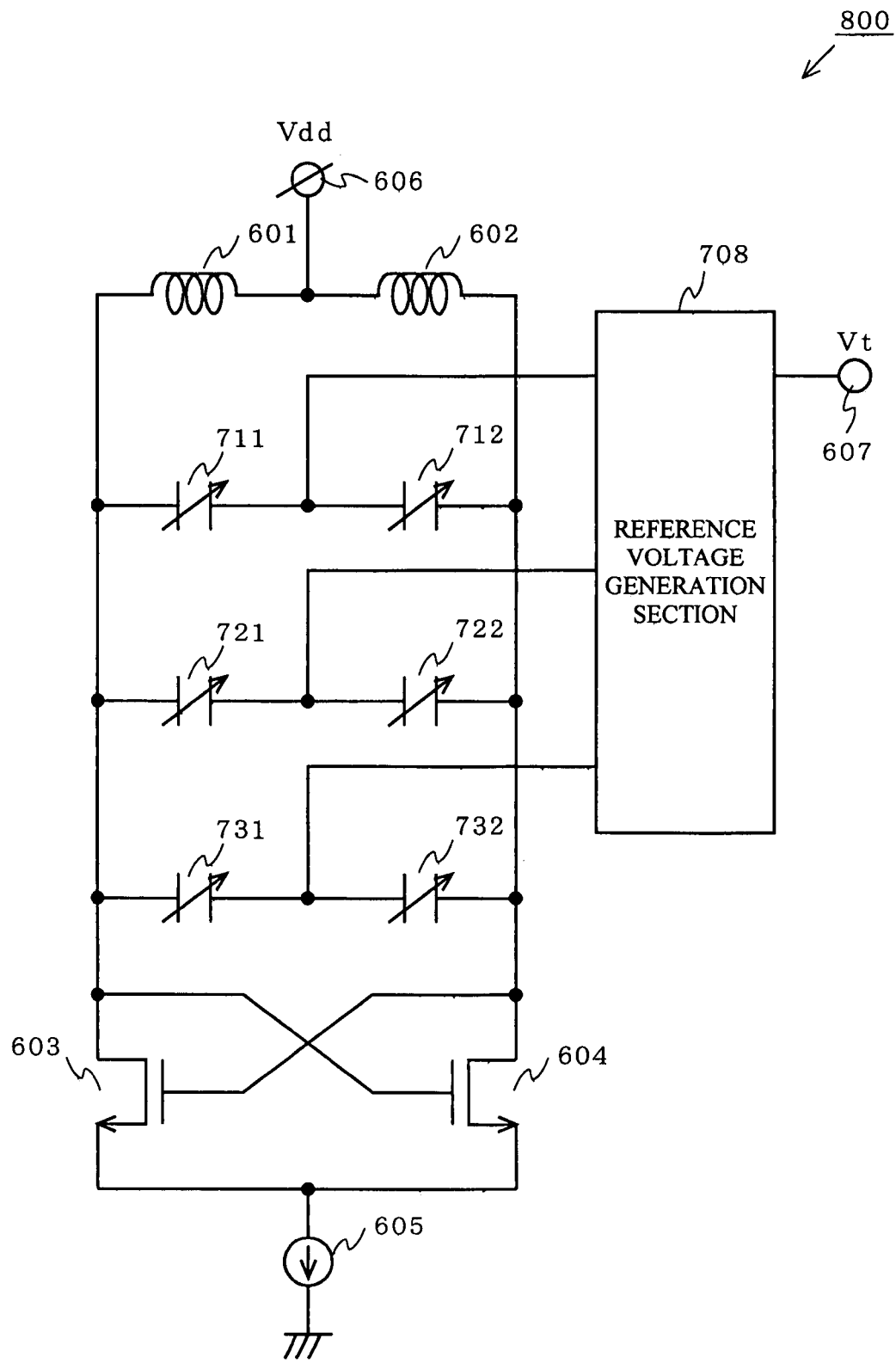
Figure 19:
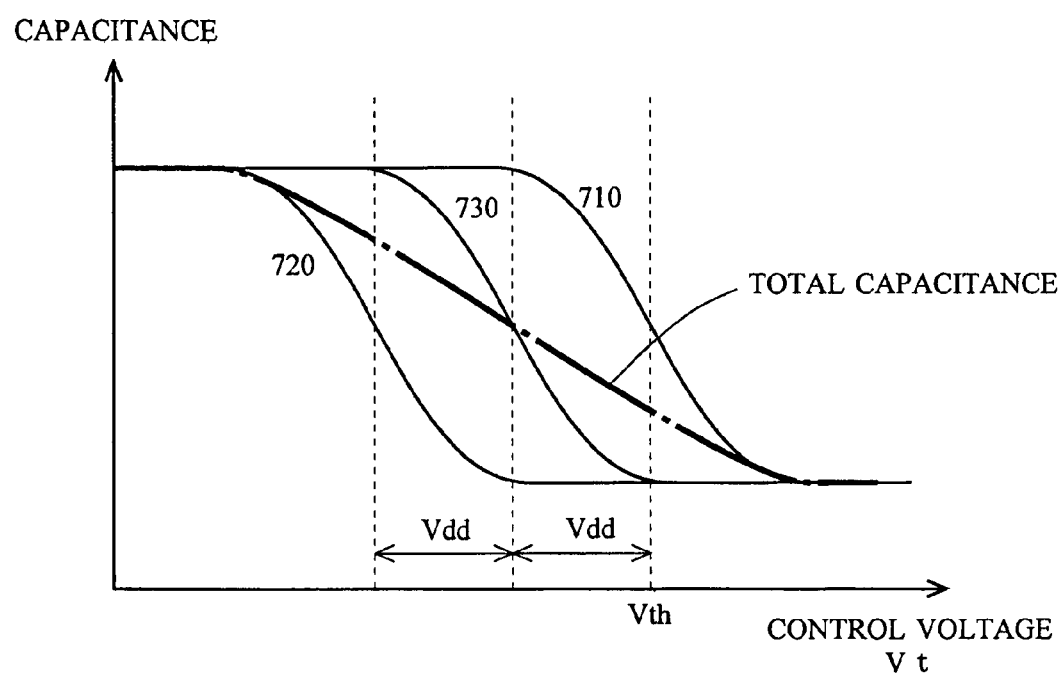
FIG. 19 shows an example of a change of the capacitance value with respect to the control voltage Vt in FIG. 17.

FIG. 14 shows an exemplary structure of a wireless communication apparatus 500 using the PLL circuit 400 described above. As shown in FIG. 14, the wireless communication apparatus 500 includes an antenna 501, a power amplifier 502, a modulator 503, a switch 504, a low noise amplifier 505, a demodulator 506, and the PLL circuit 400.

For transmitting a wireless signal, the modulator 503 modulates a desired radio frequency signal which is output from the PLL circuit 400 with a baseband modulation signal and outputs the resultant signal. The radio frequency modulated signal which is output from the modulator 503 is amplified by the power amplifier 502 and radiated outside from the antenna 501 via the switch 504. For receiving a wireless signal, a radio frequency modulated signal received via the antenna 501 is input to, and amplified by, the low noise amplifier 505 via the switch 504, and then input to the demodulator 506. The demodulator 506 demodulates the input radio frequency modulated signal to a baseband modulation signal with a radio frequency signal which is output from the PLL circuit 400. A plurality of PLL circuits 400 may be provided for the transmission side and the receiving side. The PLL circuit 400 may be also used as a modulator.

As described above, the present invention can realize a PLL circuit and a wireless communication apparatus capable of improving the linearity of the frequency sensitivity over a wide range of control voltage.

While the invention has been described in detail, the foregoing description is in all aspects illustrative and not restrictive. It is understood that numerous other modifications and variations can be devised without departing from the scope of the invention.

What is claimed is:

1. A voltage controlled oscillator for oscillating a radio frequency signal, the voltage controlled oscillator comprising:
    an inductor circuit including an inductor;
    a variable capacitance circuit including a variable capacitance element for changing a capacitance value in accordance with a voltage difference between both of two terminals thereof and including a capacitive element, for cutting a DC component, connected to the variable capacitance element, the variable capacitance circuit being connected in parallel to the inductor circuit, such that the variable capacitance circuit and the inductor circuit form a parallel resonance circuit;

a negative resistance circuit for cancelling a loss caused by a parasitic resistance component of the parallel resonance circuit; and a time-switched level shift circuit for shifting a reference voltage to be output to two or more different levels in a predetermined period;

wherein one terminal of the two terminals of the variable capacitance element is supplied with a control voltage for controlling an oscillation frequency, and the other terminal of the two terminals of the variable capacitance element is supplied with the reference voltage that shifts to the two or more different levels in the predetermined period and that is output from the time-switched level shift circuit, such that a capacitance value of the variable capacitance circuit changes in accordance with the reference voltage that shifts to the two or more different levels in the predetermined period.

2. A voltage controlled oscillator for oscillating a radio frequency signal, the voltage controlled oscillator comprising:

an inductor circuit including an inductor;

a variable capacitance circuit including a variable capacitance element for changing a capacitance value in accordance with a voltage difference between both of two terminals thereof and including a capacitive element, for cutting a DC component, connected to the variable capacitance element, the variable capacitance circuit being connected in parallel to the inductor circuit, such that the variable capacitance circuit and the inductor circuit form a parallel resonance circuit;

a negative resistance circuit for cancelling a loss caused by a parasitic resistance component of the parallel resonance circuit; and a time-switched level shift circuit for shifting a voltage to be output to two or more different levels in a predetermined period;

wherein one terminal of the two terminals of the variable capacitance element is supplied with a control voltage for controlling an oscillation frequency and the voltage that shifts to the two or more different levels in the predetermined period and that is output from the time-switched level shift circuit, and the other terminal of the two terminals of the variable capacitance element is supplied with a fixed reference voltage, such that a capacitance value of the variable capacitance circuit changes in accordance with the voltage that shifts to the two or more different levels in the predetermined period.

3. A voltage controlled oscillator for oscillating a radio frequency signal, the voltage controlled oscillator comprising:

an inductor circuit including an inductor;

a variable capacitance circuit including a variable capacitance element for changing a capacitance value in accordance with a voltage difference between both of two terminals thereof, the variable capacitance circuit being connected in parallel to the inductor circuit, such that the variable capacitance circuit and the inductor circuit form a parallel resonance circuit;

a negative resistance circuit for cancelling a loss caused by a parasitic resistance component of the parallel resonance circuit; and a time-switched level shift circuit for shifting a voltage to be output to two or more different levels in a predetermined period;

wherein one terminal of the two terminals of the variable capacitance element is supplied with a control voltage for controlling an oscillation frequency and the voltage that shifts to the two or more different levels in the predetermined period and that is output from the time-switched level shift circuit, such that a capacitance value of the variable capacitance circuit changes in accordance with the voltage that shifts to the two or more different levels in the predetermined period.

4. A voltage controlled oscillator according to claim 1, wherein the time-switched level shift circuit continuously increases a level of the reference voltage from a minimum level to a maximum level, and continuously decreases the level of the reference voltage from the maximum level to the minimum level.

5. A voltage controlled oscillator according to claim 2, wherein the time-switched level shift circuit continuously increases a level of the voltage from a minimum level to a maximum level, and continuously decreases the level of the voltage from the maximum level to the minimum level.

6. A voltage controlled oscillator according to claim 3, wherein the time-switched level shift circuit continuously increases a level of the voltage from a minimum level to a maximum level, and continuously decreases the level of the voltage from the maximum level to the minimum level.

7. A voltage controlled oscillator according to claim 1, wherein the time-switched level shift circuit randomly changes a level of the reference voltage.

8. A voltage controlled oscillator according to claim 2, wherein the time-switched level shift circuit randomly changes a level of the voltage.

9. A voltage controlled oscillator according to claim 3, wherein the time-switched level shift circuit randomly changes a level of the voltage.

10. A voltage controlled oscillator according to claim 1, wherein the two or more different levels of the reference voltage output by the time-switched level shift circuit are set such that each voltage difference between each adjacent level of the two or more different levels of the reference voltage is the same.

11. A voltage controlled oscillator according to claim 2, wherein the two or more different levels of the voltage output by the time-switched level shift circuit are set such that each voltage difference between each adjacent level of the two or more different levels of the voltage is the same.

12. A voltage controlled oscillator according to claim 3, wherein the two or more different levels of the voltage output by the time-switched level shift circuit are set such that each voltage difference between each adjacent level of the two or more different levels of the voltage is the same.

13. A voltage controlled oscillator according to claim 1, wherein the two or more different levels of the reference voltage output by the time-switched level shift circuit are set such that at least one voltage difference of voltage differences between each adjacent level of the two or more different levels of the reference voltage is different from a remainder of the voltage differences.

14. A voltage controlled oscillator according to claim 2, wherein the two or more different levels of the voltage output by the time-switched level shift circuit are set such that at least one voltage difference of voltage differences between each adjacent level of the two or more different levels of the voltage is different from a remainder of the voltage differences.

15. A voltage controlled oscillator according to claim 3, wherein the two or more different levels of the voltage output by the time-switched level shift circuit are set such that at least one voltage difference of voltage differences between each adjacent level of the two or more different levels of the voltage is different from a remainder of the voltage differences.

16. A voltage controlled oscillator according to claim 1, wherein the time-switched level shift circuit shifts the reference voltage to be output to the two or more different levels such that the two or more different levels appear at an identical ratio in the predetermined period.

17. A voltage controlled oscillator according to claim 2, wherein the time-switched level shift circuit shifts the voltage to be output to the two or more different levels such that the two or more different levels appear at an identical ratio in the predetermined period.

18. A voltage controlled oscillator according to claim 3, wherein the time-switched level shift circuit shifts the voltage to be output to the two or more different levels such that the two or more different levels appear at an identical ratio in the predetermined period.

19. A voltage controlled oscillator according to claim 1, wherein the time-switched level shift circuit shifts the reference voltage to be output to the two or more different levels such that the two or more different levels appear at a different ratio in the predetermined period.

20. A voltage controlled oscillator according to claim 2, wherein the time-switched level shift circuit shifts the voltage to be output to the two or more different levels such that the two or more different levels appear at a different ratio in the predetermined period.

21. A voltage controlled oscillator according to claim 3, wherein the time-switched level shift circuit shifts the voltage to be output to the two or more different levels such that the two or more different levels appear at a different ratio in the predetermined period.

22. A voltage controlled oscillator according to claim 1, wherein the time-switched level shift circuit is structured using a digital-analog converter.

23. A voltage controlled oscillator according to claim 2, wherein the time-switched level shift circuit is structured using a digital-analog converter.

24. A voltage controlled oscillator according to claim 3, wherein the time-switched level shift circuit is structured using a digital-analog converter.

25. A voltage controlled oscillator according to claim 1, wherein the time-switched level shift circuit is structured using an analog-digital converter.

26. A voltage controlled oscillator according to claim 2, wherein the time-switched level shift circuit is structured using an analog-digital converter.

27. A voltage controlled oscillator according to claim 3, wherein the time-switched level shift circuit is structured using an analog-digital converter.

28. A voltage controlled oscillator according to claim 1, wherein the time-switched level shift circuit is structured using a delta-sigma modulation circuit.

29. A voltage controlled oscillator according to claim 2, wherein the time-switched level shift circuit is structured using a delta-sigma modulation circuit.

30. A voltage controlled oscillator according to claim 3, wherein the time-switched level shift circuit is structured using a delta-sigma modulation circuit.

31. A voltage controlled oscillator according to claim 1, wherein the time-switched level shift circuit is structured using a delta-sigma modulation circuit and a low pass filter.

32. A voltage controlled oscillator according to claim 2, wherein the time-switched level shift circuit is structured using a delta-sigma modulation circuit and a low pass filter.

33. A voltage controlled oscillator according to claim 3, wherein the time-switched level shift circuit is structured using a delta-sigma modulation circuit and a low pass filter.

34. A PLL circuit, comprising a voltage controlled oscillator according to claim 1.

35. A PLL circuit, comprising a voltage controlled oscillator according to claim 2.

36. A PLL circuit, comprising a voltage controlled oscillator according to claim 3.

37. A wireless communication apparatus, comprising a voltage controlled oscillator according to claim 1.

38. A wireless communication apparatus, comprising a voltage controlled oscillator according to claim 2.

39. A wireless communication apparatus, comprising a voltage controlled oscillator according to claim 3.

* * * * *

UNITED STATES PATENT AND TRADEMARK OFFICE
CERTIFICATE OF CORRECTION

PATENT NO. : 7,567,139 B2  Page 1 of 1
APPLICATION NO. : 11/882945
DATED : July 28, 2009
INVENTOR(S) : Takayuki Tsukizawa It is certified that error appears in the above-identified patent and that said Letters Patent is hereby corrected as shown below:

On the Cover Page below Item (65) Prior Publication Data, insert:

-- (30), Foreign Application Priority Data
August 9, 2006 [JP]   Japan                2006-217370 --

Signed and Sealed this

Twenty-third Day of November, 2010

David J. Kappos
Director of the United States Patent and Trademark Office